(12) United States Patent
Auguste et al.

(10) Patent No.: US 9,372,213 B2
(45) Date of Patent: Jun. 21, 2016

(54) SENSORS FOR ELECTRICAL CONNECTORS

(71) Applicant: Alpha and Omega, Inc., Denver, CO (US)

(72) Inventors: Donna Marie Auguste, Denver, CO (US); David Edward Hayes, Denver, CO (US); Klaus J. Dimmler, Colorado Springs, CO (US); Alan D. Devilbiss, Colorado Springs, CO (US)

(73) Assignee: ALPHA AND OMEGA, INC., Denver, CO (US)

( * ) Notice: Subject to any disclaimer, the term of this patent is extended or adjusted under 35 U.S.C. 154(b) by 650 days.

(21) Appl. No.: 13/767,659

(22) Filed: Feb. 14, 2013

(65) Prior Publication Data

US 2014/0225603 A1 Aug. 14, 2014

(51) Int. Cl.

| G01R 21/00 | (2006.01) |
|---|---|
| G01R 21/08 | (2006.01) |
| G01R 19/25 | (2006.01) |
| G01R 21/133 | (2006.01) |

(52) U.S. Cl.
CPC ............ *G01R 21/08* (2013.01); *G01R 19/2513* (2013.01); *G01R 21/00* (2013.01); *G01R 21/133* (2013.01)

(58) Field of Classification Search
None
See application file for complete search history.

(56) References Cited

U.S. PATENT DOCUMENTS 5,428,288 A * 6/1995 Foreman ............ H01R 13/6397
324/142

5,844,759 A * 12/1998 Hirsh ................... H02H 11/005
361/103

(Continued)

FOREIGN PATENT DOCUMENTS

WO WO 2012156712 A2 * 11/2012 .......... H02J 13/0013

OTHER PUBLICATIONS

Laske, Matthias; Ludwig, Josef; Unseld, Günther; Weiß Alfred; "Cylinder Head Gaskets with Integrated Temperature Sensors Detecting Critical Component Temperatures in the Heart of the Engine", ATZonline.com; MTZ worldwide Edition: Dec. 2002, Printed: Aug. 21, 2013, pp. 1-2; Website: http://www.atzonline.com/Article/1132/Cylinder-Head-Gaskets-with-Integrated-Temperature-Sensors-Detecting-Critical-Component-Temperatures-in-the-Heart-of-the-Engine.html.

(Continued)

*Primary Examiner* — Jermele M Hollington
*Assistant Examiner* — Suresh K Rajaputra
(74) *Attorney, Agent, or Firm* — TIPS Group

(57) ABSTRACT

In some implementations, a sensing apparatus for an appliance connector, set forth by way of example and not limitation, includes at least one substrate including one or more openings operative to receive a corresponding number of prongs of the appliance connector. At least one sensor is coupled to the substrate and is operative to sense at least one characteristic of an environment. A transmitter is coupled to the substrate and is operative to transmit one or more signals derived from the at least one sensed characteristic, where the transmitted signals are capable of being received by a receiving device. A power circuit is coupled to the substrate and is operative to provide power to the at least one sensor and to the transmitter, where the power circuit can receive electric current from at least one of the prongs of the appliance connector to drive the transmitter and the sensor.

19 Claims, 25 Drawing Sheets

(56) References Cited

U.S. PATENT DOCUMENTS

| | | | | |
|---|---|---|---|---|
| 2008/0224861 A1* | 9/2008 | McNeely | A61B 5/0006 | 340/540 |
| 2010/0327766 A1* | 12/2010 | Recker | H02J 9/02 | 315/291 |
| 2011/0014800 A1* | 1/2011 | Cheng | H01R 12/716 | 439/55 |
| 2011/0109301 A1* | 5/2011 | Johnson | H01R 13/6633 | 324/119 |
| 2011/0133655 A1* | 6/2011 | Recker | H02J 9/02 | 315/159 |
| 2011/0276289 A1* | 11/2011 | Park | G01R 21/133 | 702/62 |
| 2011/0316690 A1* | 12/2011 | Siegman | H05K 7/1498 | 340/538 |
| 2012/0080944 A1* | 4/2012 | Recker | H02J 9/02 | 307/25 |
| 2015/0253365 A1* | 9/2015 | Auguste | G01R 21/00 | 324/251 |

OTHER PUBLICATIONS

Product Brochure, "SensorCS® Cylinder-Head Gaskets", Dana Limited, Aug. 21, 2013; p. 1; Website: http://162.74.99.105/Automotive_Systems/Products/Sealing%20Products/CHG/sensor_gasket.aspx.

* cited by examiner

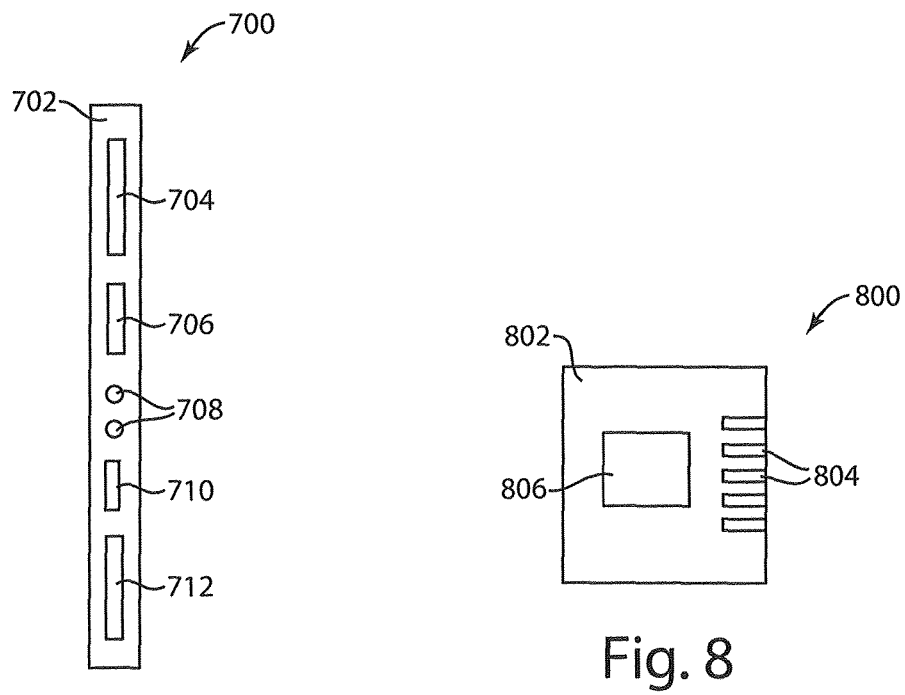
Fig. 7
Fig. 8
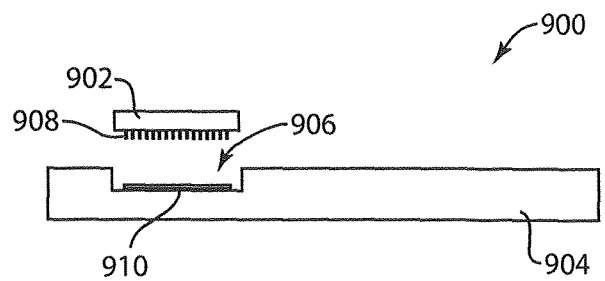
Fig. 9

SENSORS FOR ELECTRICAL CONNECTORS

CROSS-REFERENCE TO RELATED APPLICATIONS

This application claims the benefit of U.S. Patent Application No. 61/599,113, filed Feb. 15, 2012, which is incorporated herein by reference in its entirety.

BACKGROUND

Sensing devices are used in many different applications for sensing a wide variety of different parameters or characteristics. Sensed characteristics can be used to monitor the operation of mechanical, electrical, chemical, and other phenomenon. For example, sensing devices can be capable of sensing such characteristics as temperature, pressure, electric and magnetic fields, gas and vapor concentration, odor, power, audio, and video. Some sensing devices are capable of transmitting signals indicative of sensed characteristics to other devices for processing and monitoring.

In some applications, multiple sensing devices can be used in a sensor network. For example, some sensor networks include sensors capable of simultaneously detecting various characteristics at localized points over a wide area. When taken in aggregate, the information provided by these various sensing devices can be processed and reduced to an actionable result based on the multiple sensed locations. In some implementations, each sensor device within the network can include components to read data from a transduction detector, perform some local processing, and/or send data to a centralized server. At the server, data from various sensor types and sensor locations can be used to produce an actionable result.

Existing sensing devices tend to be large, intrusive and cumbersome. For example, U.S. Pat. No. 8,192,929 discloses a "smart wall socket" that has outlets into which appliances can be plugged, and the outlet is in turn plugged into a standard wall socket. But this device is too large and too expensive to place in an area where space comes at a premium, nor is suitable for placement in large numbers. In another example, U.S. Patent Publication 2008/0215609 discloses sensors for collecting data and interpreting aggregate data from a network of various sensor types. However, such sensors are also of a relatively large size and often not practical to place in large numbers. In living quarters or office space, for example, numerous such large sensors would be conspicuous and impractical. In other environments, space utility is required to be optimized, as for example in a data center.

In U.S. Pat. No. 5,589,764, a power meter is described that can be plugged into an electrical wall socket, which provides its own socket into which an electrical appliance is inserted. A measured current drawn by the appliance that is plugged into the unit is converted to energy metrics and are displayed on a display screen on the power meter. Another implementation is disclosed in U.S. Pat. No. 8,041,369, where the measured data is transmitted wirelessly to a centralized server. These approaches make measurements by passing the current through the meter in series with the appliance. It is for this reason that these types of power meters are of a form that plugs into an outlet socket, and provide another separate outlet socket into which the appliance is plugged. However, this approach results in a power meter that is very bulky and is impractical to associate with many appliances, thereby resulting in incomplete information in environments having several appliances. Further, the substantial cost of materials to produce such power meters can be a major concern.

These and other limitations of the prior art will become apparent to those of skill in the art upon a reading of the following descriptions and a study of the several figures of the drawing.

SUMMARY

In some implementations, a sensing apparatus for an appliance connector, set forth by way of example and not limitation, includes at least one substrate including one or more openings operative to receive a corresponding number of prongs of the appliance connector. At least one sensor is coupled to the substrate and is operative to sense at least one characteristic of an environment. A transmitter is coupled to the substrate and is operative to transmit one or more signals derived from the at least one sensed characteristic, where the transmitted signals are capable of being received by a receiving device. A power circuit is coupled to the substrate and is operative to provide power to the at least one sensor and to the transmitter, where the power circuit can receive electric current from at least one of the prongs of the appliance connector to drive the transmitter and the sensor.

In various example implementations of the sensing apparatus, the apparatus can include a gasket housing that is separate from and physically engaged with a housing of the appliance connector. The gasket housing can house the transmitter and the power circuit, and the gasket housing can include a plurality of openings operative to receive a plurality of prongs of the appliance connector. The gasket housing can be engaged with the prongs while the appliance connector is connected to an electrical outlet, and the power circuit can generate DC power from the electric current flowing through the at least one prong. The DC power can be provided to drive at least the sensor and the transmitter. In other implementations, the sensing apparatus can include at least one circuit board provided within a housing of the appliance connector, where the transmitter and power circuit are housed within the housing of the appliance connector.

In some implementations, the sensor can sense at least one characteristic of the electric current flowing through the prong, and the transmitted signals can include information indicative of a power consumption of the appliance. For example, the sensor can measure an intensity of a magnetic field generated by the electric current passing through the at least one prong of the appliance connector. In some implementations, a ring of material is provided around at least one of the openings and has a magnetic permeability that concentrates a magnetic field generated by the electric current, where the sensor includes a Hall effect sensor. Multiple sensors of different types can be used, each type for sensing a different characteristic of the environment. The power circuit can be coupled to the at least one prong by a conductive contact or by a capacitive coupling.

One or more processors can be coupled to the sensor and transmitter. The transmitter can transmit the signals via wireless communication. A memory can storing instructions governing operation of the sensing apparatus, and a standardized interface connector can be connected to an electronic device that provides configuration and programming of the instructions. The transmitted signals can include information indicative of a power consumption of the appliance. The signals can be transmitted periodically to the receiving device that can include a remote server. In some implementations, a housing can house the power circuitry, and a removable module is physically distinct from the housing and operative to be connected to the housing by one or more connectors on the housing, where the module includes the at least one sensor, memory for storing sensor data, and/or memory for storing programming instructions for the gasket. In some implementations, a housing houses the power circuitry, the sensor, and the transmitter, where sensor and the power circuit are integrated on the substrate that is a single flex circuit board provided between a top cover and a bottom cover of the housing, and at least one ferrite ring is coupled to the flex board. The power circuit can include a surge protection circuit that protects at least the power circuit from power surges and spikes in the electric current. A location circuit can receive location signals and provide location information indicative of a physical location of the sensing apparatus, the location information to be output by the transmitter.

A system, set forth by way of example and not limitation, includes a sensing apparatus coupled to an appliance connector of an appliance, where the appliance connector is coupled to a power supply. The sensing apparatus includes at least one substrate including one or more openings operative to receive a corresponding number of prongs of the appliance connector. At least one sensor is coupled to the substrate and is operative to sense at least one characteristic of an environment. A transmitter is coupled to the substrate and is operative to transmit one or more signals derived from the at least one sensed characteristic. A power circuit is coupled to the substrate and is operative to provide power to the at least one sensor and to the transmitter, where the power circuit can receive electric current from at least one of the prongs of the appliance connector to drive the transmitter and the sensor. The system includes a receiving device located remotely from the sensing apparatus and operative to receive the signals from the transmitter. The receiving device provides the signals for use as data describing the at least one sensed environmental characteristic.

A method for sensing using a sensing device, set forth by way of example and not limitation, includes sensing at least one characteristic of an environment using at least one sensor provided in a housing and coupled to a power connector of an appliance. One or more signals are transmitted using a transmitter included in the housing, where the one or more signals are derived from the at least one sensed characteristic, and the transmitted signals are received by a receiving device. Power from the electric current is converted to a form usable by the at least one sensor and the transmitter using power circuitry included in the housing.

In various example implementations of the method, the sensing can include sensing at least one characteristic of electric current flowing through at least one of multiple prongs of the power connector. The one or more transmitted signals can include information indicative of a power consumption of the appliance. At least one ring of material can be provided around at least one prong to concentrate the magnetic field, and the sensing can include measuring an intensity of a magnetic field generated by electric current passing through the prong.

These and other combinations and advantages and other features disclosed herein will become apparent to those of skill in the art upon a reading of the following descriptions and a study of the several figures of the drawing.

BRIEF DESCRIPTION OF THE DRAWINGS

Several examples will now be described with reference to the drawings, wherein like components are provided with like reference numerals. The examples are intended for the purpose of illustration and not limitation. The drawings include the following figures:

FIG. 7 is a side view of one example implementation of a gasket;

FIG. 8 is a top plan view of an example implementation of a sensor module which can be used with some implementations of a gasket;

FIG. 9 is a side view of an example implementation of a gasket and sensor module allowing connection of a sensor module to a gasket platform;

DETAILED DESCRIPTIONS

Figure 1A:
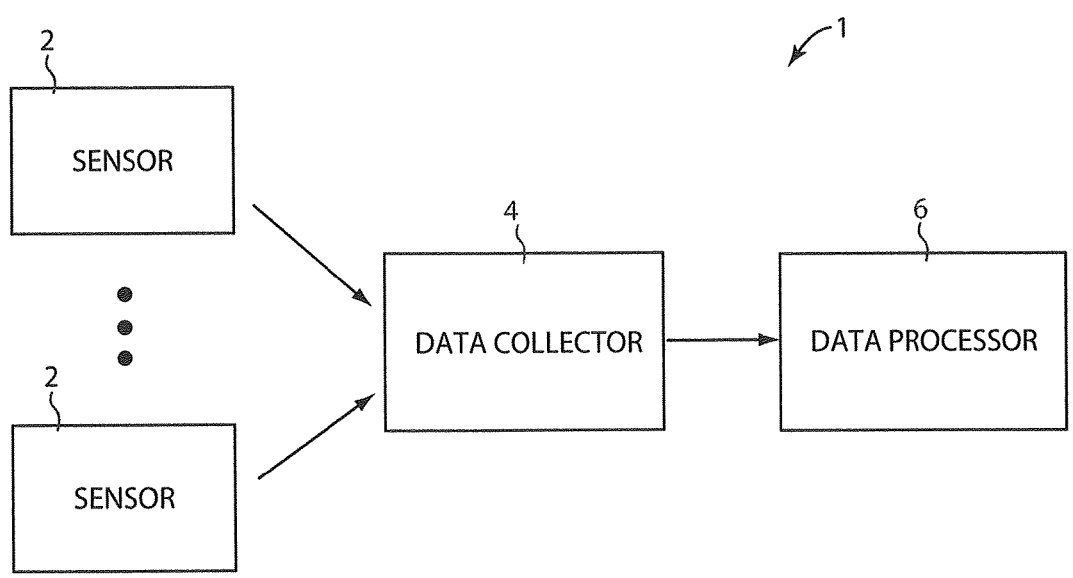
FIG. 1A is a block diagram of an example sensing system which can be used in some implementations of one or more features described herein.

One or more implementations described herein pertain to sensing characteristics related to a connector of an appliance. In some implementations, a sensing apparatus includes a substrate or circuit board and/or a housing that includes one or more openings through which prongs of an appliance connector can be inserted. One or more sensors in communication with the sensing apparatus can sense environmental characteristics, such as an electric current flowing through at least one of the prongs of the appliance connected. A transmitter of the sensing apparatus can transmit signals based on the sensed characteristics. A power circuit of the sensing apparatus can provide power from the electric current to sensing apparatus components such as the sensors, sensor circuit, and transmitter.

In some example implementations, the sensing apparatus can be included in a gasket that is slipped on the prongs of a power connector such as an AC plug of an appliance, which in turn is connected to a power supply, such as an electrical outlet. For example, the gasket can be integrated with various types of sensor transducers to measure a wide variety of environmental characteristics, including characteristics related to the power connector. In some implementations, the gasket can measure the current drawn through a prong in the plug using magnetic sensing such as Hall sensing, and can convert that measurement to digital format. For example, each of multiple gaskets can continuously calculate the energy consumed by the appliance via the associated power connector over a particular or specified period of time, and can transmit the measured sensed consumption as data to a centralized device. In some implementations, the centralized device can be a server or other electronic device which can process and interpret aggregated data received from multiple gaskets, each gasket monitoring a different appliance.

A gasket or other sensing apparatus can accommodate a variety of different sensor transduction devices. For example, some gasket implementations can include a platform component including circuitry used to perform functions other than the sensing function, such as a power supply, controller, transmitter, and antenna. Various sensing devices can be removably connected to the platform component to provide various types of sensor functionality.

Various techniques can be used to retrieve data sensed by the sensing apparatus. In some example implementations, a data collector manages a sensor network to receive sensor data and other information from one or more sensing apparatus, such as gaskets, via a wireless communication. The data collector can, in turn, provide sensor data and other information to a server or other data processor for analysis and/or user access. A server can associate a particular user with one or more sets of associated sensing apparatus and sensor data obtained from those sensing apparatus, and allow users to log in to access their associated sensor data and/or analysis pertaining to the sensor data.

In some implementations, a gasket can function as a power meter that is small, unobtrusive, and low cost to produce. The gasket can also sense other characteristics of the appliance and/or environment in which the gasket is located. In some implementations, the gasket can measure power consumption by measuring the current that is drawn through the appliance without inserting a measuring device in series with appliance in the path of the current. Due to small size and low cost, a gasket can be used in conjunction with each of a large number of appliances to provide aggregate data describing the sensed conditions of the appliances. On a server level, this data can be organized and analyzed to produce increased value. One or more features of the sensor gasket can be useful when used to measure power consumption of a connected appliance. This can be a significant step in movement toward green energy and power conservation due to the importance of individual consumer awareness of how the consumers are using energy. For example, availability of sensed data on a level of individual appliances allows consumers to easily determine how to reduce their power consumption.

As used herein, an "appliance" or the like refers to any electric or electronic device having a connector which can be engaged by the sensor gasket to monitor environmental characteristics related to the connector and/or environment. Non-limiting examples of appliances include desktop computers, laptop or netbook computers, tablet computers, personal digital assistants (PDAs), media players, cellular telephones, printers, stereos or audio output devices, televisions, telephones, home appliances and devices (refrigerator, toaster, dishwasher, coffee maker, clothes washer and/or dryer, etc.), air conditioners, heaters, fans, or any other device. The appliance may include a connector having one or more "prongs," which can be any prongs, pins, extensions, conductors, or other conductive male connector protrusions of an appliance connector through which current can flow.

FIG. 1A is a block diagram of a sensing system 1 which can be used in some implementations of one or more features described herein. In this example implementation, one or more sensing apparatus or sensors 2 communicate with a data collector 4 which communicates with a data processor 6. The communication links can be wired, wireless, or otherwise. In some implementations, the sensors 2, data collector 4 and data processor 6 are physically separated apparatus which communicate, at least in part, wirelessly, e.g. by radio frequency (l.f.) transmission. In some example implementations, the circuitries of one or more of the sensors and data collector are, at least in part, combined. In some example implementations the circuitry of the data collector 14 and the data processor 16 can be combined. In other example implementations the circuitry of one or more of the sensors 12, the data collector 14, and the data processor 16 can be combined.

That is, as contemplated herein, the functions of sensing, data collections and data processing can be distributed or integrated.

Figure 1B:
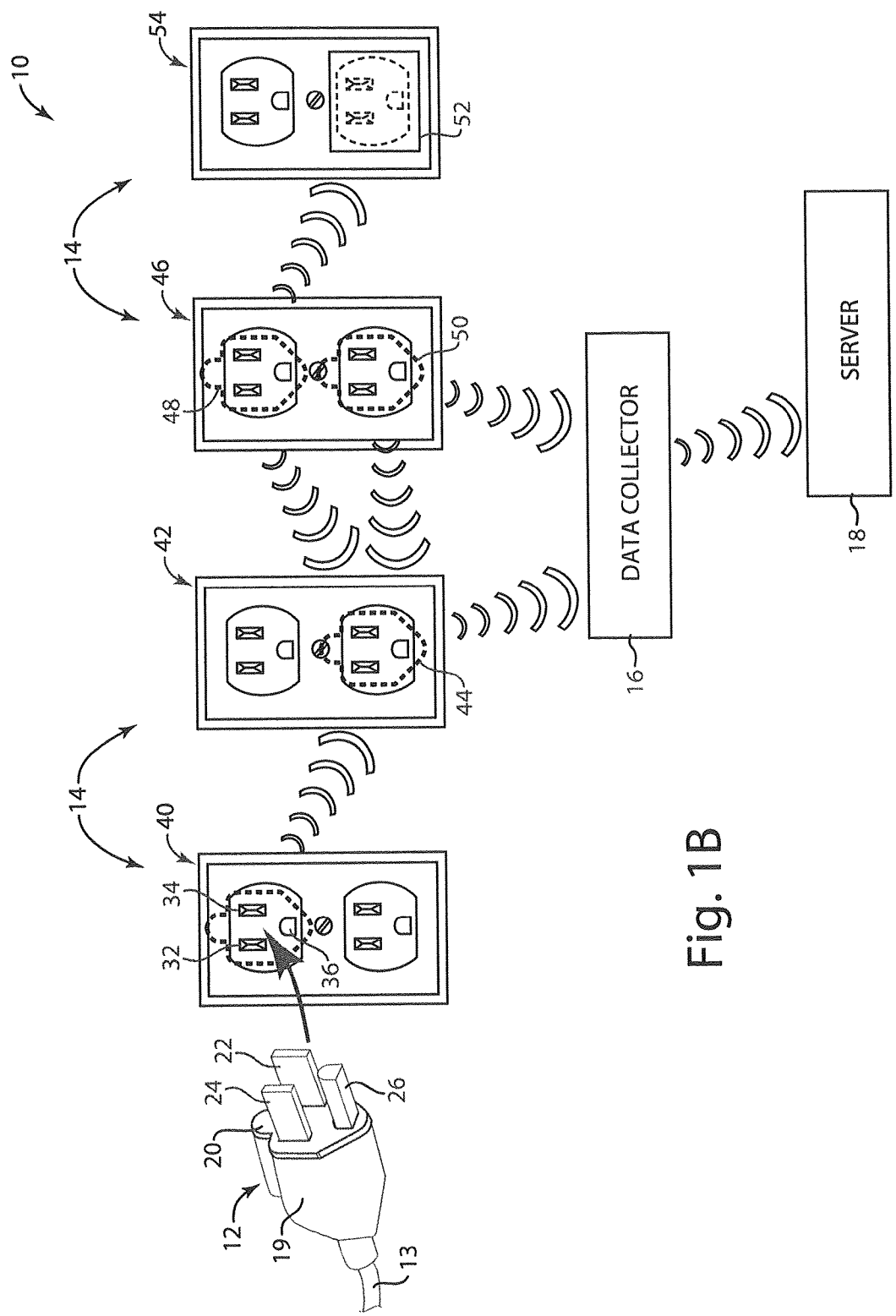
FIG. 1B is a block diagram of an example implementation of a sensing system that can include one or more features described herein including a sensing apparatus in the form of a sensing gasket.

FIG. 1B is a block diagram of an example implementation of a sensing system 10 which can be used in some implementations of one or more features described herein. In this example, the sensing system 10 includes one or more sensing apparatus provided as appliance connectors 12 including one or more sensing features described herein, where the connectors 12 can each be removably connected to a corresponding mating connector 14. A data collector 16 can be used in some implementations to receive data transmitted by the appliance connectors 12 which is related to environmental characteristics sensed by sensors in association with the connectors. In some implementations of system 10, one or more data collectors 16 can be used locally to the appliance connectors 12 to receive data sent by the connectors 12, and the data collectors 16 can send received data to a data processor such as a centralized server 18 which processes data aggregated from multiple appliance connectors 12.

In some implementations, appliance connector 12 can be or include a plug head 19, such as a power plug head connected to a power cord 13 and used to provide power to an appliance connected to the plug head via the cord 13. For example, such a plug head 19 can be mated with a supply connector 14 providing power. In some implementations, the appliance connector 12 can be a male connector and the supply connector 14 can be a female connector such as a socket in an electrical outlet or other receptacle, e.g., a wall outlet commonly provided on interior walls of buildings, or a socket provided on a power extension cord or power strip. In other implementations, the appliance connector 12 can be a female connector and the supply connector 14 can be a male connector. Other implementations can use other types of appliance connectors instead of a plug head 19, such as any of various connector types for providing an electrical connection. Furthermore, the appliance connector can be a connector that provides power to the appliance as well as communicating other signals, such as data (commands, parameters, etc.).

Sensing functionality described herein is provided by a sensing apparatus associated with an appliance connector 12. In some implementations, one or more of the sensing features described herein are provided by a sensing apparatus at least partially housed in a gasket 20 that has a separate housing from the housing of an appliance connector 12 and physically couples to, attaches to, or otherwise engages with the housing of the appliance connector 12. In one example, the gasket 20 includes one or more openings and can be slipped over prongs 22, 24, and 26 on plug head 19, where the plug head 19 is in turn plugged into the corresponding supply connector 14 such as socket 40 with corresponding openings 32, 34 and 36, thereby connecting circuitry within gasket 20 to hot, neutral, and ground connections of the outlet 14, respectively. The ground connection corresponding to prong 26 and socket opening 36 can optionally be included for some implementations. Thus the gasket 20 can be situated between a power outlet and the face of a plug head. It is noted that outlets 14 standard to the USA are shown in FIG. 1, though any country's or other type of power outlet or socket standard can be used. In some example implementations, the plug head 19 with gasket 20 can be plugged into a top socket for outlet 40, into a bottom socket as shown in outlet 42 with plug-head/gasket 44, or in both sockets as shown in outlet 46 with plug-head/gaskets 48 and 50. In some implementations, the plug head 19 and gasket 20 can be plugged into a power strip, electrical power extension cord, power adapter, or other power receptacle or adapter.

The gasket 20 can include functionality for sensing one or more environmental characteristics of an environment. In certain examples, the environment surrounds a sensor and in other examples the sensor may surround the environment or be proximate to an environment. In some examples, a sensed environmental characteristic can be a sensed characteristic of electric current drawn through the appliance connector 12. For example, sensing system 10 including one or more gasket 20 can be used for monitoring alternating current (A.C.) line power usage. Other characteristics can alternatively or additionally be sensed, such as temperature of the connector or air near the gasket, air pressure in the environment, and/or other characteristics, as described below.

In other implementations, the gasket 20 can be attached to an appliance connector 12 in other ways. For example, the gasket may be attached to one or more sides of a housing of the appliance connector 12 and have contacts routed to the connector prongs.

In some implementations, the sensing apparatus and sensing functionality can be integrated into the appliance connector 12. For example, a sensing apparatus can be implemented by components housed within the housing of the appliance connector 12 and there need not be a separate gasket engaged with the appliance connector 12. For example, any or all gasket components described herein, such as one or more circuit boards, one or more sensors, ring of ferrite material, circuitry, processors, memory, and other components can be integrated into the housing of the appliance connector 12. In some examples, one or more gasket components can be integrated into the connector housing near the prong-end of the housing, similarly as if a gasket had been engaged with the prongs at that end of the housing. For example, a sensor and sensor ring can be positioned relative to prongs of the connector similarly as described herein for gasket implementations. In some implementations, the gasket components can be positioned anywhere within the housing of connector 12.

The gasket 20 can in some implementations include components to enable communication to provide information related to the environmental characteristics sensed by the gasket 20. This information can be transmitted to other systems or devices via wireless communication. For example, wireless circuitry can be included in or connected to gasket 20 to transmit data that is collected by the gasket to centralized data collector 16 and/or server 18. In other implementations, gasket 20 can transmit data via wired communication, such as via one or more cables, traces, etc.

The data collector 16 can be any device that receives the data sent by one or more gaskets 20 provided on associated connectors 12. Data collector 16 can collect aggregate data from multiple such gaskets 20. For example, data collector 16 can be a device capable of processing the received data to provide actionable information, such as a computer server or other electronic device. In some implementations, data collector 16 can be a device that collects gasket sensor data locally and then re-transmits the data via a communication protocol to a non-local centralized server 18. For example, the data collector can provide received signals to a server 18 for use as data describing one or more sensed environmental characteristics. In some examples, data collector 16 can be a small computer or other device which can provide local processing and then transmit the results of that local processing to a centralized server 18 via wireless or wired communication. For example, the collector can be a plug computer 52 that plugs directly into an outlet receptacle 54 similarly to the appliance connector 12. In one example, receptacle 54 can be a different receptacle in a location near enough to one or more gaskets 20 to enable communications with those gaskets 20.

Plug computer 52 can provide standard computing features in a small space, and can for example include a CPU or other processor, memory (e.g., flash memory and/or dynamic memory), network capability, etc. In some examples, the plug computer 52 can operate on a reduced or compact operating system. One example of a commercially available plug computer is the SheevaPlug™ computer from Marvell Semiconductor, Inc. Other implementations can provide a variety of other types of collector 16 devices. Some implementations can provide a data collector 16 in or more of the gaskets 20.

Centralized server 18 can be included in system 10 in some implementations as a data processing device. Server 18 can be an electronic device such as a computer server, desktop computer, portable computer or device, or other device. Server 18 can be remote from the connector 12, gasket 20, and data collector(s) 16. The server 18 can receive data signals from one or more data collectors 16 at various locations which have aggregated data from one or more sensing gaskets 20 at various other locations local to each data collector 16. For example, the data collector 16 can send the data signals via a standard protocol, wirelessly and/or through wired channels, using the Internet or private network, to be received by the centralized server 18. Server 18 can provide the signals for use by itself or other devices as data describing one or more sensed environmental characteristics. For example, server 18 can process and analyze the received data signals to determine the status of the monitored environmental conditions, such as current consumption of the appliances connected to the appliance connectors 12. The server 18 may also be able to determine whether an actionable result exists based on the processed data, and can take particular actions in some implementations. Such action can be, for example, providing information or alerts to users or other devices, and/or providing commands or signals back to the data collectors 16 and/or gaskets 20 to start, modify, and/or stop particular functions implemented by the data collectors and/or gaskets. In some non-limiting examples, a number of gaskets 20 can communicate wirelessly with data collector 14 which, in turn, communicates with a web server provided on server 18 via a connection to a wireless router (not shown) coupled to a network such as the Internet. The data collector, in this example, can accumulate and forward sensing data from a number of gaskets 20 to the server 18. The user can manipulate the sensor data via a web site provided by that server, for example. Some implementations can use multiple data collectors placed with the receiving distance of a set of gaskets. In some example implementations for home consumer use, multiple gaskets can be used within a residence and correspond to a single account; for example, a data collector can be provided on each floor of a typical home.

A variety of wireless communication protocols are suitable for the local wireless communication between the gaskets 20 and the data collector 16. In implementations having a power plug 12 and receptacle 14 as shown in FIG. 1, power can be drawn from the receptacle and so conservation of power may not be a constraint. Some implementations provide a small and thin gasket 20 and so the communication protocol can support a transceiver size and antenna requirements that can be accommodated in the space available. In some examples, a network architecture can be used that reduces layering, exposes hardware functions directly to applications and middleware, and/or includes a single unifying layer of abstractions that includes interpreted scripts and simple program processes. Some implementations can use a network protocol using radio communication, where a varied analog and digital interface is handled by different messages within the protocol. In some examples, the communication can be based on an existing communication protocol such as the 802.15.4 communication standard. Some implementations can, for example, use a ZigBee® networking protocol, which is built on top of the 802.15.4 standard and includes an application-specific communication signaling protocol between devices (also referred to as mesh networking). For example, ZigBee is a low-power standard that has a defined rate of 250 kbps and is suitable for periodic or intermittent data or a single signal transmission from a sensor or input device. In some examples, a Zigbee-like wireless protocol can be used between the gaskets 20 and the data collectors 16, and a different wireless protocol (such as 802.15.4) can be used between the data collectors 16 and server 18. Other protocols with similar functionality can alternatively be used. This type of capability can enable each gasket 20 to transmit information to another gasket in the vicinity, which in turn transmits the information to another gasket, ultimately relaying the data to the data collector 16 and/or server 18. Such implementations can, for example, increase the maximum distance between the furthest gasket and the collector, provided that there are gaskets located between the endpoints that relay the information.

Some implementations of the gasket can collect current sensor data and calculate average values as described in greater detail below. In some implementations, packets transmitted from the gasket can include a header that includes an IP address and media access control (MAC) address assigned to the gasket and identifying the gasket on the network. At the receiving device (e.g., data collector 16 or server 18), a gasket's MAC address and IP address can be associated with the received average data by interrogating the header section of the received information packet. In some implementations, sensor data received from multiple gaskets can be accumulated by the data collector 16 (or a server) and put together into a single TCP/IP information packet, which is then transmitted to a server or other data processing device.

Some implementations can use a network protocol offering features such as self-configuration and security. For example, these features can be incorporated into the networking protocol. Self-configuration can automatically establish an identity of a gasket 20 within the network, e.g., through the means of an internet protocol (IP) address, and/or establish communication to other gaskets 20 in the vicinity of the gasket that can accept data for relaying. Security features can include identifying a specific data collector 16 to which the gasket 20 should be sending data. This can avoid a possibility of a gasket sending data to an incorrect or unrelated data collector 16 within the range of the gasket 20, such as a different user's data collector 16. Another security feature can include encryption of the data during transmission to avoid unauthorized interception.

Figure 2:
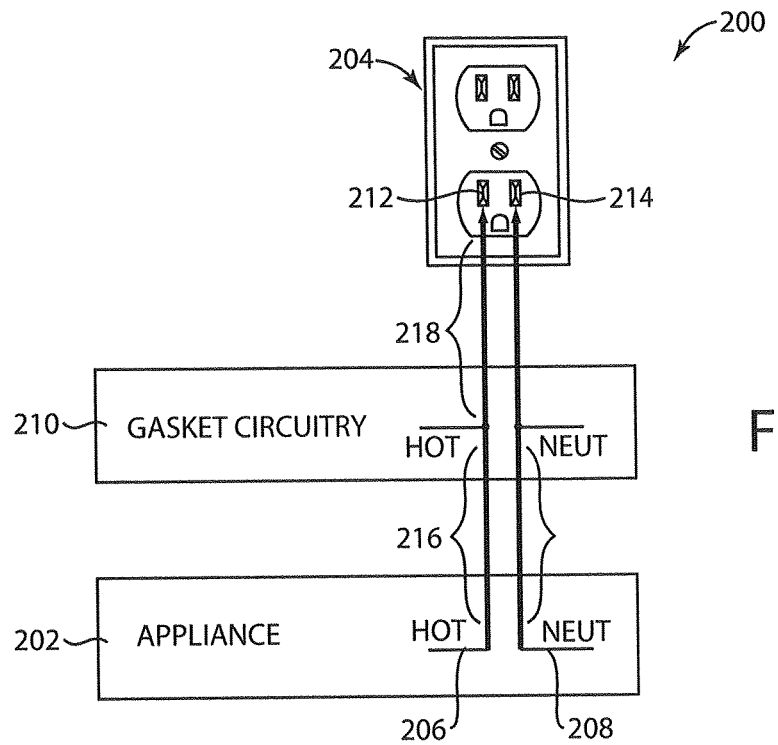
FIG. 2 is a diagrammatic illustration of an example implementation including one or more of the sensing gasket features described herein.

FIG. 2 is a diagrammatic illustration of an example implementation 200 including one or more of the sensing features described herein. In this example, power can be distributed to an appliance that is plugged into an electrical outlet using an appliance connector with a gasket slipped over the prongs of the appliance connector. With reference to FIG. 2, an appliance 202 is electrically connected to a power supply connector such as an electrical outlet 204 by a hot wire 206 and a neutral wire 208. Gasket circuitry 210 is within a gasket engaged with the appliance connector and is also coupled to the hot wire 206 and the neutral wire 208.

Power is provided to appliance 202 through hot wire 206 connected to hot outlet opening 212, and neutral wire 208 is connected to neutral outlet opening 214. Power is provided to the gasket circuitry 210 by drawing power from hot wire 206 and neutral wire 208, such that the gasket circuitry is connected electrically in parallel to the appliance 202. In this circuit configuration, the current drawn by appliance 202 flows through a segment 216 of hot wire 206 between the appliance 202 and the hot connection of the gasket circuitry 210. Segment 218 carries the cumulative current drawn by appliance 202 and gasket circuit 210.

The current drawn by gasket circuitry 210 is independent of the current drawn by appliance 202. In some implementations, the hot wire 206 passes through an opening in the gasket housing the gasket circuitry 210. The current drawn by the appliance 202 can be measured by the gasket by determining the current passing through hot wire 206. In some implementations, this current can be measured by measuring an electromagnetic field radiated by hot wire 206, as described below.

Figure 3:
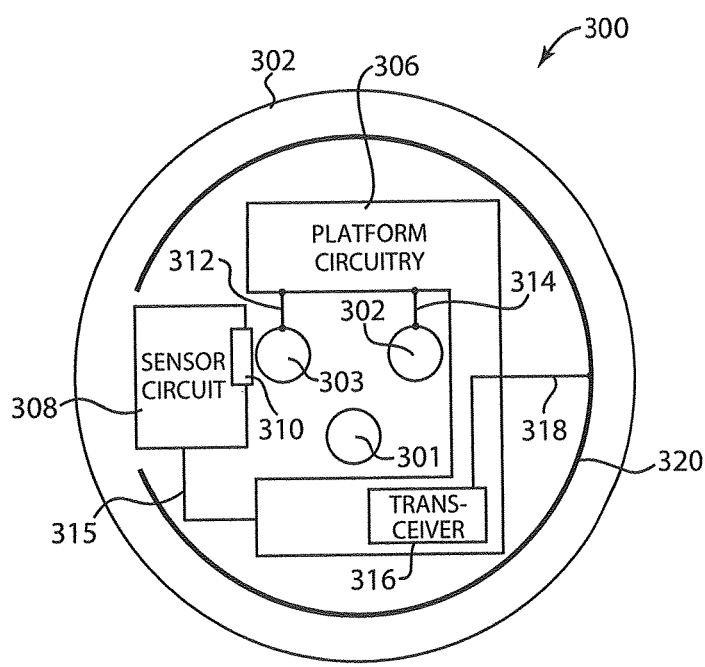
FIG. 3 is a top view of an example gasket circuit board which can be used in some implementations.

FIG. 3 is a top view of an example circuit board 300 which can be used in some implementations of a sensing apparatus, including a sensing gasket as described herein. In this example, the circuit board 300 utilizes a round circuit board or substrate 302 and in some implementations can include multiple openings to allow passage therethrough by a corresponding number of prongs of an appliance connector such that the prongs can be inserted into or otherwise connected to a power supply connector. For example, three openings 301, 302, and 303 can be used, where three prongs of a power connector such as an AC plug can be inserted through these openings to connect to hot, neutral, and ground connections of an electrical socket, respectively. Other implementations can use a different number, configuration, and/or shapes of openings 301-303 depending on the configuration of connector prongs and socket openings.

In some implementations, a portion of the area of circuit board 300 can hold platform circuitry 306, and another portion can hold sensor circuitry 308. Both the platform circuitry 306 and the sensor circuitry 308 can be powered by coupling to a hot terminal 312 and neutral terminal 314 which receive current from particular prongs of the appliance connector inserted through the openings. Various implementations for making this coupling and receiving this power are described below with respect to FIGS. 11-14. Platform circuitry 306 can be connected to the sensor circuitry 308 via a connection 315. The sensor circuitry 308 can include one or more sensors 310, such as sensors integrated on the circuit board 300 in some implementations. Various implementations can also or alternatively provide one or more sensors 310 separately from and connected to the circuit board 300.

In the implementation shown in FIG. 3, a sensor 310 is included in the sensor circuitry 308 to sense one or more environmental characteristics. In some examples described herein, the sensor can sense one or more characteristics of current flowing through the hot conductor of the appliance prong 303. For example, a magnetic field caused by the current can be sensed to derive the magnitude of current flowing through the connector over time. In some implementations, for example, the sensing gasket can sense other environmental characteristics instead of or in addition to sensing current. In various implementations, one or more sensors can sense one or more of a variety of different environment characteristics, including temperature, pressure, electric and magnetic fields, vibration, movement, gas and vapor concentration, odor, power, audio sounds, visual images or colors or patterns, etc.

Figure 21:
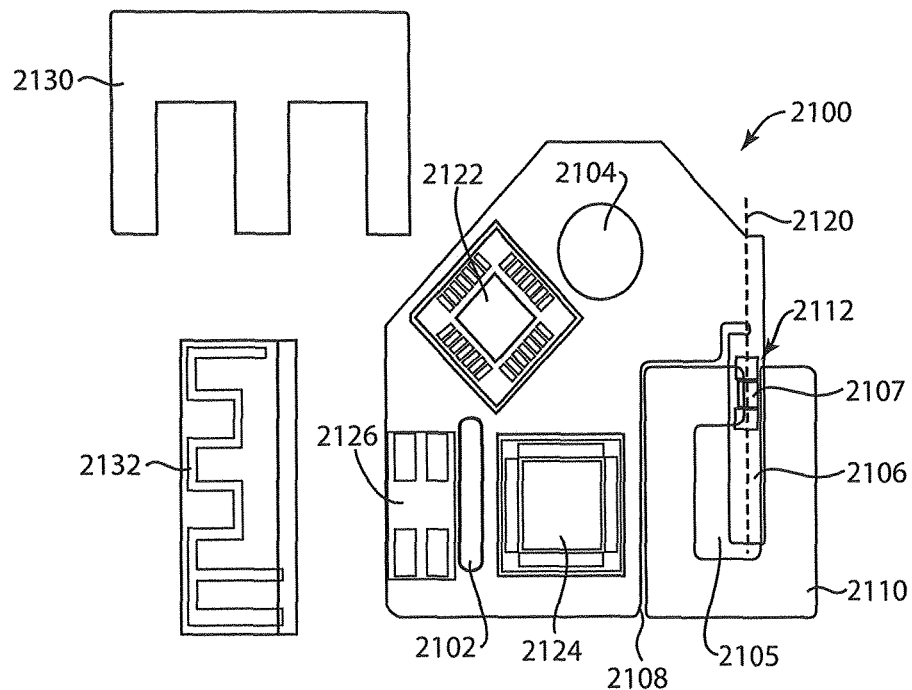
FIG. 21 is a top view of an example implementation of a flex circuit board that can be used in some implementations of a gasket.

The sensor circuitry 308 and/or platform circuitry 306 can obtain one or more signals derived from the sensed characteristic sensed by the sensor 310 and provide one or more signals suitable to be transmitted from the gasket. In some implementations, the platform circuitry 306 can include wireless transceiver circuitry 316 (functionally shown in FIG. 3) which is connected via a connection 318 to an antenna 320 to transmit the sensor-derived signals wirelessly. In some implementations, the antenna can also receive wireless signals, such as from data collector 16 and/or server 18. In some examples, the antenna 320 can be configured to wrap around the periphery of the gasket circuit board 300 near the edge of the board, as shown. In other implementations, antenna 320 can be a straight or linearly-shaped conductor or be of a different shape or configuration, some examples of which are shown in FIG. 21. In yet other implementations, the functionality of the antenna 320 can be provided by an antenna integrated circuit chip. In some examples, antenna chips provided by Fractus S. A. or Johanson Technology, Inc. can be suitable for some implementations.

Figure 4:
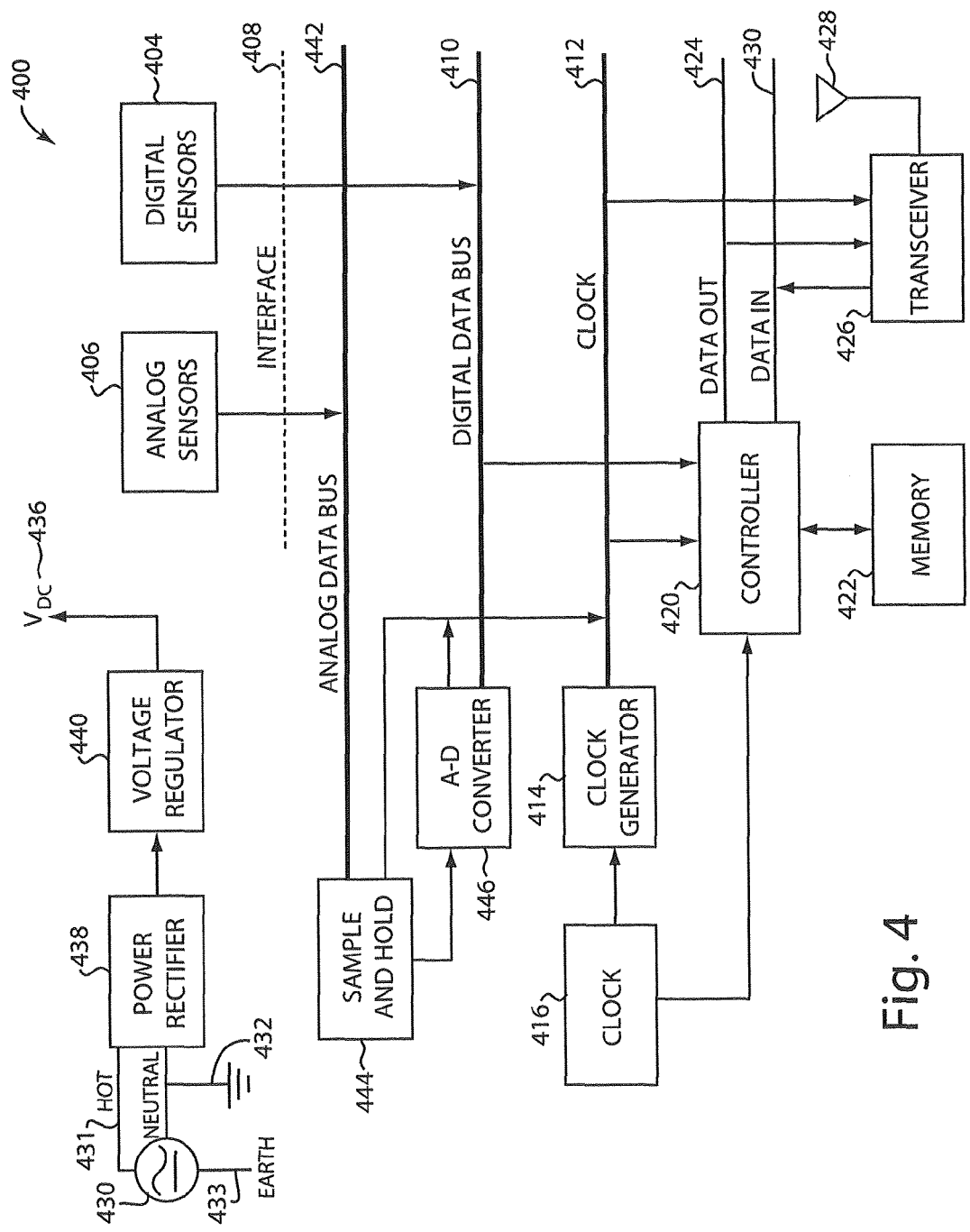
FIG. 4 is a block diagram illustrating a component system of a sensing gasket according to some implementations.

FIG. 4 is a block diagram illustrating a component system 400 of a sensing apparatus such as a sensing gasket according to some implementations. For example, in some implementations the components of the component system 400 can include circuitry such as platform circuitry 306 and/or sensor circuitry 308 as shown in FIG. 3. In other embodiments, the circuitry can be compartmentalized or divided in other ways or based on other functionality. In various implementations, one or more digital sensors 404 and/or one or more analog sensors 406 can be used to sense environmental conditions relative to the sensors or gasket. For example, in some implementations a single digital or analog sensor can be used, while in other implementations multiple digital and/or analog sensors can be used.

The system 400 can include a standard interface 408 to connect the sensors 404 and/or 406. The interface 408 supports electrical connections from digital sensors 404 to a digital data bus 410 and a clock bus 412. The digital data bus 410 can receive sensor data describing one or more sensed environmental condition as sensed by the digital sensors 404. A clock signal on clock bus 412 can be generated by clock generator circuitry 414 which can generate the signal based on input from a real-time clock 416. The clock signal can be used by the digital sensors 404 to time the sensing of environmental conditions, among other timing functions used by the circuitry.

A controller 420 can be connected to the digital data bus 410, clock bus 412, real time clock 416 and a memory 422. For example, the controller 420 can be any suitable processor, such as one or more microprocessors, microcontrollers, application-specific integrated circuits (ASICs), logic gates, etc. Received sensor data can be processed by the controller 420 and resulting processed data placed on a data out bus 424. This output data can be sent to a data collector, server, or other device. For example, in some implementations the data can be output wirelessly by transceiver 426, which can be coupled to an antenna 428. For example, data can be transmitted periodically by the transceiver 426 based on environmental characteristics continually being sensed by the sensors 404 and/or 406. The transceiver 426 can also be capable of receiving data wirelessly from other devices such as data collector 16 and/or server 18. For example, the received data can include program instructions, commands, parameters, and/or data, which can be placed on the data input bus 430 and provided to controller 420. Memory 422 can be utilized to store buffered incoming sensor data, program instructions for controller 420, parameters, or other data. In some implementations, controller 420 can include the memory 422 and/or additional memory to memory 422 as integrated memory for storing some or all of these types of data.

Power for component system 400 can in some implementations be provided from an AC voltage of a connected power source 430, which in some examples can be an electrical outlet 430 including a hot terminal 431, neutral terminal 432, and optionally an earth ground connection 433. The AC voltage 430 can be converted to a controlled DC voltage 436 utilizing power rectifier 438 and voltage regulator 440. The DC voltage can be used as a supply by the gasket circuitry, sensors, and any other components of the gasket. In other implementations, the component system 400 can receive power from different and/or additional power sources, such as batteries. In some implementations, power can be wirelessly transmitted from a remote source. For example, magnetic resonators can be used to transfer power wirelessly over distances.

Some implementations can alternatively or additionally use one or more analog sensors 406 providing analog sensor signals. Additional converter circuitry, such as a sample and hole and/or analog-to-digital converter, can be included in such implementations to convert the analog sensor signals to a digital format. For example, the output of analog sensor 406 can be coupled to an analog data bus 442, which in turn can be coupled to a sample and hold block 444 which uses the clock signal from clock bus 412 to sample the analog sensor signals. The sampled signals can be provided to an analog-to-digital converter that converts the received analog data to digital data for use by the controller 420. In various implementations, the analog-to-digital converter can be integrated in the controller 420, or the analog-to-digital converter can be a separate component 446 which converts the analog signal from the sample and hold block 444 to digital data and provides that digital data on the digital data bus 410 to the controller 420.

In implementations using a wireless transceiver 426, any of a variety of wireless protocols can be used. In one example implementation, a ZigBee transceiver design can be used that is based on the 802.15.4 radio transmission protocol, such as a Zigbit™ chip from Atmel Corporation. In another example implementation, wireless standards such as Wi-Fi based n 802.11 can be used with components designed for that standard. In some non-limiting examples, programmable microcontroller (MCU) 2205 and Wi-Fi transceiver 2210 from Cypress Semiconductor Corporation can be used.

Figure 5:
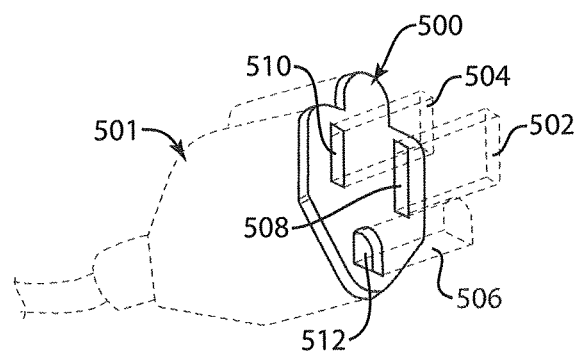
FIG. 5 is a perspective view of an example of a sensing gasket that can be used in some implementations.

FIG. 5 is a perspective view of an example of a sensing gasket 500 that can be used in some implementations. In the example of FIG. 5, gasket 500 can be slipped over prongs of a power connector such as an AC plug 501 connected to an appliance, where the plug is shown in phantom lines. The plug 501 is designed to connect to an electric outlet providing 120 V AC, 240 V AC, etc. In the example shown, prongs 502, 504, and 506 are inserted through openings 508, 510, and 512 of the gasket 500, respectively, such that the gasket 500 is seated against the housing of the plug 501. In some examples, prong 502 is the hot contact, prong 504 is the neutral contact, and prong 506 is a ground contact. The openings 508-512 are shown as shaped in rectangular or partially curved shapes to fit the prongs intended for use with the gasket. Other implementations can use circular or oval openings (as shown in FIG. 3) or openings having other shapes or dimensions. Some implementations can provide sufficiently large openings and/or flexible terminals or contacts to allow the gasket to fit many different plug or connector configurations. Furthermore, the plug 501 and gasket 500 are shown having an approximate wedge cross-sectional shape with a rounded protrusion on one side, but can be provided in other shapes or combinations of shapes in other embodiments, such as circular, rectangular, etc.

Figure 6:
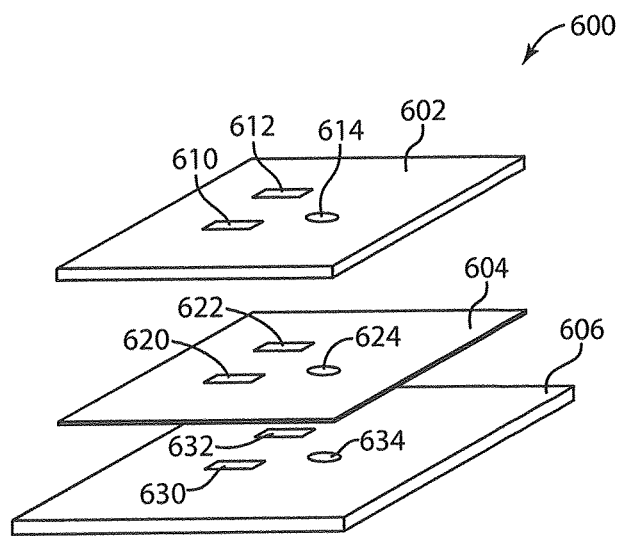
FIG. 6 is an exploded perspective view of an example implementation of a sensing gasket.

FIG. 6 is an exploded perspective view of an example implementation of a gasket 600 similar to the gasket 500 shown in FIG. 5 or the gasket 20 shown in FIG. 1. Gasket 600 can include a housing that includes a top cover 602 and a bottom cover 606 and which house a circuit board 604. The top and bottom covers 602 and 606 can be made of plastic or other insulative material in some implementations. The circuit board 604 can be a thin substrate that includes circuitry implementing the gasket circuitry, sensor circuitry, and/or sensors described above. In some implementations, the circuit board 604 can be sandwiched between top cover 602 and interlocking bottom cover 606. Covers 602 and 606 and circuit board 604 can be square or rectangular in shape as shown, wedge-shaped as shown in FIGS. 1 and 5, circular shaped, or otherwise shaped. Other implementations can include a single cover for a housing, which can be integrated with the circuit board in some implementations.

In some implementations, flex board or other thin circuit board substrate can be used for circuit board 604. In other implementations, circuit board 604 can be encapsulated in plastic or other material by producing a mold with circuit board 604 inside the encapsulation. When the gasket 600 is in use, conductive prongs of the appliance connector can be inserted through openings 610, 612, and 614 in the top plate 602, through aligned openings 620, 622, and 624 in the circuit board 604, and through openings 630, 632, and 634 in bottom plate 606. A coupling mechanism as described below can provide electrical connection between the inserted prongs of the AC plug and the gasket circuitry.

FIG. 7 is a side view of one example implementation of a gasket 700. In some embodiments, one or more edges 702 of the gasket 700 can include various connectors, interfaces, indicators, and/or other I/O components. In some examples, an interface connector 704 can be provided for a standard interface such as USB or other type. The connector 704 can allow connection of the gasket to a variety of devices, such as to a computer, cell phone, or other electronic device to facilitate configuration and programming of the gasket code, parameters and/or operation, connection to additional memory, peripherals, or sensors, etc. A memory slot 706 can be provided to connect to separate, small form-factor memory modules such as micro-SD. LED light indicators 708 can be provided to indicate any of a variety of gasket states, sensor states, I/O states, etc. A reset button 710 can be provided to allow reset of one or more states of the gasket 700. A sensor connector 712 can be used in some implementations to connect a separate sensor module that allows placement of one or more gasket sensors in a different location in the vicinity of the gasket 700.

FIG. 8 is a top plan view of an example implementation of a separate sensor module which can be used with some implementations of a gasket described herein. In some implementations, the sensor circuit of the gasket can constructed on the same circuit board substrate as the platform circuitry, as shown in the example of FIG. 3, or in another substrate included in the housing of the gasket. In other implementations, the sensor circuitry 308 and platform circuitry 306 as shown in FIG. 3 can be provided on separate circuit boards in separate modules, and can be connected together as interlocking modules. For example, the sensor circuit 308 can be included in a small form factor module 800 having a circuit board 802 and a connector 804 on one side of the circuit board 802. Some implementations can provide a portion of the sensor circuit 308 in module 800 and another portion in the gasket. Connector 804 can in some implementations correspond to a standard interface 408 as shown in FIG. 4. For example, some implementations can allow sensor modules to be supplied by one or more additional suppliers which can connect to the standard interface connector on the gasket housing. Sensor circuit 806 can be integrated on the circuit board 802 of the sensor module 800, and can include one or more sensors in some implementations, or can connect to a separate sensor provided on board 802 or otherwise within a housing of the sensor module 800.

Module 800 can be connected to a connector of the gasket. In some implementations, the module 800 can be connected to connector such as a slot 712 on the side of the gasket 700 shown in FIG. 7. Some implementations can connect the sensor module 800 with a gasket using a cable or wire. The gasket 700 can include platform circuitry such that connector 804 makes electrical contact with that platform circuitry, e.g., via a standard interface 408 to a bus on the platform circuitry. By separating the sensor module and the gasket platform, a generic gasket platform can be provided in the gasket. The generic gasket platform can be connected to a variety of multiple different sensor types by attaching the appropriate sensor module(s) to the platform, allowing different environmental characteristics to be sensed as appropriate to particular applications. In some implementations, multiple sensor slots 712 can be provided on the gasket 700, allowing multiple sensor modules 800 to be connected, where the sensors of the connected modules can be the same or of differing types. Some implementations can allow sensors to be connected to a gasket via a standard interface connector such as USB, memory card connector, etc. Various implementations can include other components in a sensor module 800 in addition to one or more sensors, such as processor(s), memory for storing sensor data, memory for storing program instructions for the processor(s), power supply, circuitry, etc. Furthermore, some implementations can use a similar removable module that does not include sensors or sensor circuitry and which includes one or more of the other components.

FIG. 9 is a side view of an example implementation 900 of a gasket and sensor module allowing connection of a sensor module to a gasket platform. A sensor module 902 can include sensor circuitry similarly as module 800 of FIG. 8, and a gasket 904 includes platform circuitry and a cavity 906 provided in one side of the gasket 904. Electrical contact can be made between leads 908 on sensor module 902 with corresponding contacts 910 in the cavity 906 of gasket 904. In some implementations, the sensor module 902 can snap into the cavity 906 such that when the sensor module is snapped into place, the surface of sensor module 902 opposite to its leads is approximately flush with the corresponding surface of gasket 904, thus reducing the size of the overall gasket assembly.

Figure 10:
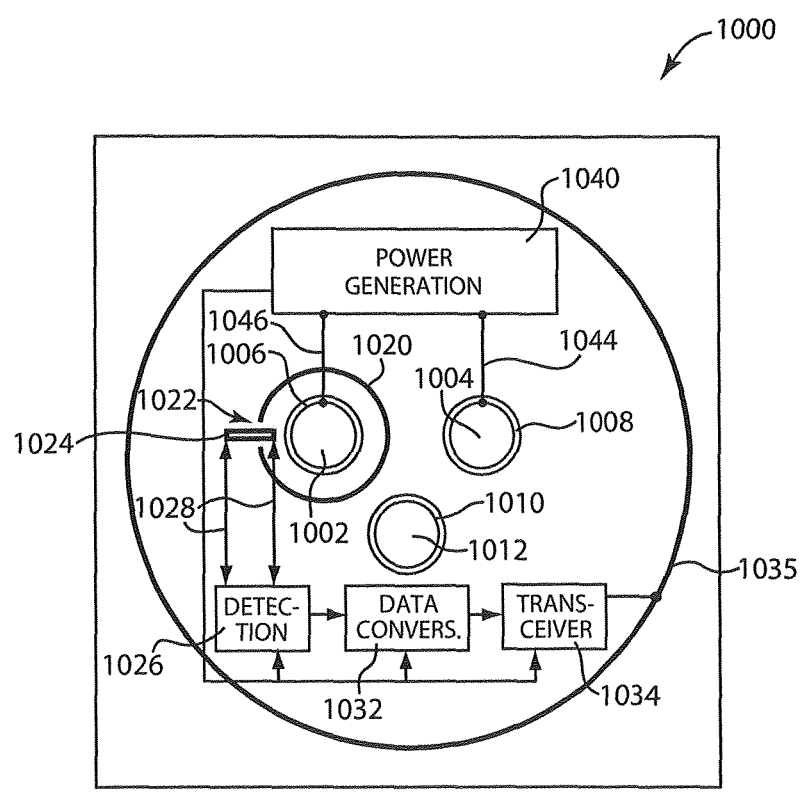
FIG. 10 is a top view of an example implementation of a gasket circuit board in which a magnetic sensor is used.

FIG. 10 is a top view of an example implementation of a circuit board 1000 which can be used in a sensing apparatus and in which a magnetic sensor is used. In some implementations, a gasket including circuit board 1000 is placed over the conductive prongs of an appliance connector, such as an AC plug head. This results in the prongs 1002 and 1004 extending through openings 1006 and 1008. In the described implementation, opening 1006 is designated as a "hot" opening and prong 1002 is designated the "hot" power conductor. Opening 1008 is designated as a "neutral" opening and prong 1008 is designated the "neutral" power conductor. In some implementations, a third opening 1010 and a third prong 1012 can be used, referred to as "ground." In some implementations, for example, the third opening 1010 on the gasket can correspond with the placement of a third prong on a three-prong plug.

A ring of material 1020 can be provided to surround the hot opening 1006, and a gap 1022 can be included in ring 1020. Ring 1020 can be made of a material that has the property of high magnetic permeability, such as a ferrite material. Current travelling through prong 1002 induces a magnetic field and ring 1020 concentrates that magnetic field. This can increase the strength of the magnetic field for easier measurement as well as stabilize a signal sensed from the magnetic field by significantly reducing dependence on the distance between ring 1020 and prong 1002.

A sensor can be positioned to measure an intensity of the generated magnetic field. In the described implementation, a Hall effect sensor 1024 can be mounted within gap 1022 of the ring 1020. For example, the Hall effect sensor 1024 can be positioned at a right angle to the magnetic field concentrated by the ring 1020. The magnitude of the magnetic field that is experienced by the Hall effect sensor 1024 can be detected by detection circuitry 1026, which can be included in the sensor circuitry for example. The detection circuitry 1026 can be coupled to the Hall effect sensor 1024 through conductors 1028 and provides analog signals representative of the sensed magnetic field. The analog output of detection circuitry 1026 can be converted to a sensor signal in a digital data format by analog-to-digital data conversion circuitry 1032, which in turn can send the digital data signal to a transceiver such as a data transceiver 1034. In some implementations, the transceiver 1034 can transmit the digital data signal wirelessly via an antenna 1035 to any data collector or server within suitable range.

Detection circuitry 1026, data conversion circuitry 1032, and wireless data transceiver 1034 can be driven by power generated by a power generation circuit 1040. Circuit 1040 can be a DC power generation circuit in some implementations. Circuit 1040 can convert AC voltage on appliance prongs 1002 and 1004 to a DC voltage in the range of operation needed for the gasket circuitry, such as 3V to 10V in some examples. In some implementations, the input voltage from prongs 1002 and 1004 is coupled to power generation circuit 1040 via conductive terminals 1044 and 1046. In one example, each terminal can be a conductive, flexible brush that brushes against or otherwise physically contacts an associated prong 1002 or 1004 while the gasket is slipped over the plug prongs through openings 1006 and 1008. In other implementations, other types of couplings can be used to provide voltage to the power generation circuit 1040, as described below.

Figure 11:
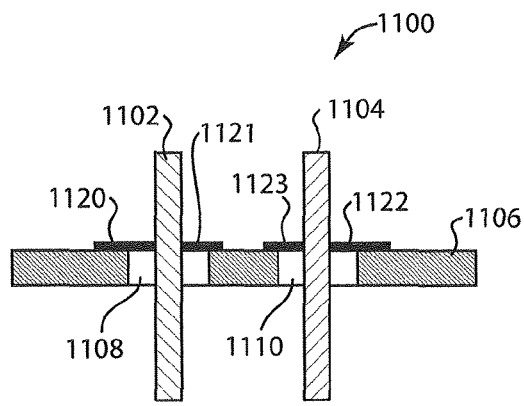
FIG. 11 illustrates an example implementation of a coupling between prongs and gasket circuitry using a metal strip or conductive brushes.

FIGS. 11-14 are side views of various implementations providing a coupling between the prongs of the appliance connector and circuitry of the sensing apparatus (such as a gasket) using power from the prongs. FIG. 11 illustrates an example implementation 1100 of a coupling that is a conductive physical conductive contact between prong and conductive terminal using a metal strip or conductive brushes. Conductive prongs 1102 and 1104 provide voltage and current and can be the hot and neutral prongs of a plug, for example. The circuit board 1106 of the gasket can include gasket circuitry as described above. Openings 1108 and 1110 are provided in the circuit board 1106 through which the prongs 1102 and 1104 extend. Terminals such as metal strips or brushes 1120 and 1122 are mounted on circuit board 1106 and connected to circuitry provided on the circuit board. The brushes 1120 and 1122 can be positioned to protrude sufficiently into corresponding openings 1108 and 1110, respectively, such that when prongs 1102 and 1104 are inserted into the openings 1108 and 1110, contact is made between the brushes and the prongs. In some implementations, the brushes 1120 and 1122 can be flexible enough to bend in response to the prongs being inserted, establishing firm contact. Some implementations also can position brushes on additional sides of the openings 1108 and 1110, such as brushes 1121 and 1123 as shown in FIG. 11. In some implementations using a ferrite ring provided around one or more openings 1108 and 1110, similarly as described for FIG. 10, the brushes 1120 and 1122 can be positioned directly over or on the ring if, for example, the ring is provided with an insulator at the points of contact, such as insulating ink, paint, or other coating. Alternatively, the ring can be positioned on the opposite side of circuit board 1106 to the brushes.

In some implementations, other conductive contacts can be used instead of strips or brushes. In some examples, spring-loaded conductive contacts can be positioned similarly to the two brushes 1120 and 1122 or similarly to the four brushes 1120-1123 shown in FIG. 11. For each spring-loaded contact, a plunger can be connected to a base with a spring where the plunger extends over the corresponding opening of the circuit board. This allows the plunger to retract away from the prong 1102 or 1104 when the prong is inserted, while maintaining contact with the prong. Spring-loaded contacts can be mounted on multiple sides of an opening and conductor in some implementations.

In other examples, ball bearing contacts can be used instead of brushes 1120-1123, which are mounted to the circuit board 1106 similarly to the brushes 1120 and 1122 and connected to the circuitry of board 1106. For each prong 1102 and 1104, a ball bearing can be placed in a ball bearing housing that includes a spring mechanism. The spring forces the ball bearing toward the prong and allows the bearing to be pushed away when a prong is inserted, maintaining contact between bearing and prong. Ball bearings can be mounted on multiple sides of an opening and prong in some implementations.

Figure 12:
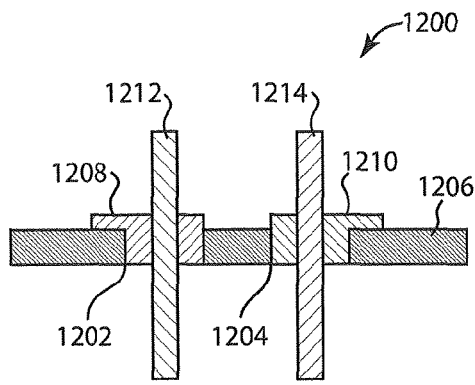
FIG. 12 illustrates an example implementation of a coupling between prongs and gasket circuitry using conductive foam.

FIG. 12 illustrates an example implementation 1200 of a coupling using conductive foam. Openings 1202 and 1204 in circuit board 1206 can be filled with conductive foam 1208 and 1210, respectively. A slit or other small opening can be allowed through the foam to allow prongs 1212 and 1214 to be inserted therethrough. The conductive foam 1208 and 1210 establishes conductive physical contact with the corresponding prong 1212 or 1214 and can overlap the surface of the circuit board where contact is made to the circuitry on the circuit board 1206. In some implementations using a ring provided around one or more openings similarly as described for FIG. 10, the conductive foam 1208 and/or 1210 can be positioned directly over or on the ring if the ring is provided with an insulator at the points of contact, such as insulating ink, paint, or other coating.

Figure 13:
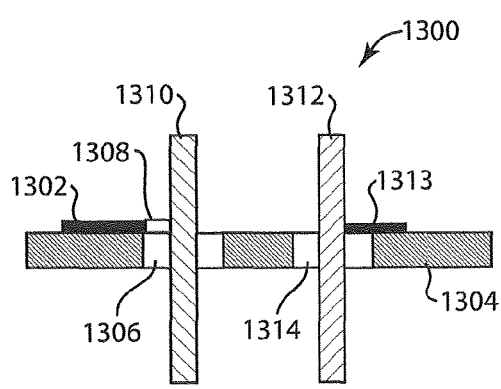
FIG. 13 illustrates an example implementation of a coupling between prongs and gasket circuitry using a capacitive coupling.

FIG. 13 illustrates another example implementation 1300 of a coupling between gasket circuitry and the connector prongs, in which a capacitive coupling is used. In this implementation, terminals connected to the gasket circuitry are not conductively contacted to one or more prongs (e.g., the conductive terminals are not extended beyond the ring into the openings for the appliance connector prongs). Instead, a circuitry terminal acts as one side of a capacitor and a prong acts as the other side of the capacitor, where a dielectric is provided between these sides to prevent conductive contact of terminal and prong and form a capacitor.

Contact 1302 can be mounted on a circuit board 1304 to the edge of an opening 1306 in the circuit board and is connected to gasket circuitry such as power generation circuit 1040. A layer 1308 can be deposited on the opening end of the contact 1302, which is a thin layer of material having high permittivity. In some non-limiting examples, the thickness of layer 1308 can be about 0.1 mm or less, and the relative permittivity can be about 1,000 or higher. In some examples, a material such as barium titanate ($BaTiO_3$) or lead zirconate titanate can be used. Optionally, layer 1308 can cover other sides of the contact 1302, such that an electrical connection can be made between the circuitry on circuit board 1304 and contact 1302 without layer 1308 being in that connection.

A coupling capacitor is formed between prong 1310 of the appliance connector (first conductive plate) and contact 1302 (second conductive plate), where layer 1308 functions as a dielectric layer positioned between the conductive plates. The neutral prong 1312 can be inserted in opening 1314 and can be electrically connected to the gasket circuitry using any of the implementations described above with reference to FIGS. 11 and 12. For example, a conductive brush 1313 similar to those shown in FIG. 11 is shown in FIG. 13.

This implementation allows an AC input voltage on the appliance connector prongs to be capacitively coupled to the gasket circuitry including the power generation circuit on the gasket, thus allowing power to be derived from the appliance connector to drive the gasket circuitry.

In some alternate implementations, gasket molding material or other material can act as a dielectric in a capacitive coupling, e.g. above or below the field concentration material of ring 1020 in a cross-sectional view of the board 1000 of FIG. 10.

Figure 14:
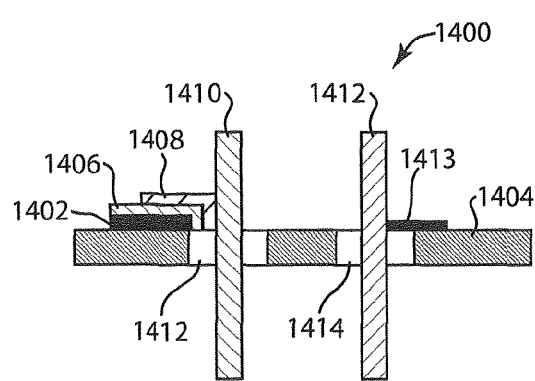
FIG. 14 illustrates another example implementation of a capacitive coupling between gasket circuitry and connector prongs.

FIG. 14 illustrates another example implementation 1400 of a capacitive coupling between gasket circuitry and the connector prongs. A contact 1402 is connected to the gasket circuitry on circuit board 1404. A high permittivity layer 1406 can coat the side and the top of the contact 1402. A layer of conductive foam 1408 can cover a part of the high permittivity layer 1406. When a hot prong 1410 is inserted through opening 1412, the conductive foam 1408 is compressed to ensure that an electrical contact exists between the prong 1410 and the high permittivity layer 1406. Thus a capacitive coupling is formed between prong 1410 and contact 1402 acting as conductive plates, with the high permittivity layer 1406 acting as a dielectric. Neutral prong 1412 can be inserted in opening 1414 and can be electrically connected to the gasket circuitry using any desired method, e.g., any of the implementations described above with reference to FIGS. 11 and 12.

In some other implementations, the layer of conductive foam 1408 can be removed, allowing an air gap to exist between conductor 1410 and high permittivity layer 1406 and connecting in series another capacitor having air as the dielectric. Such an implementation may dramatically decrease the effective capacitance between hot prong 1410 and contact 1402 and in some implementations may result in insufficient coupling for proper operation of one or more gasket circuits.

Figure 15:
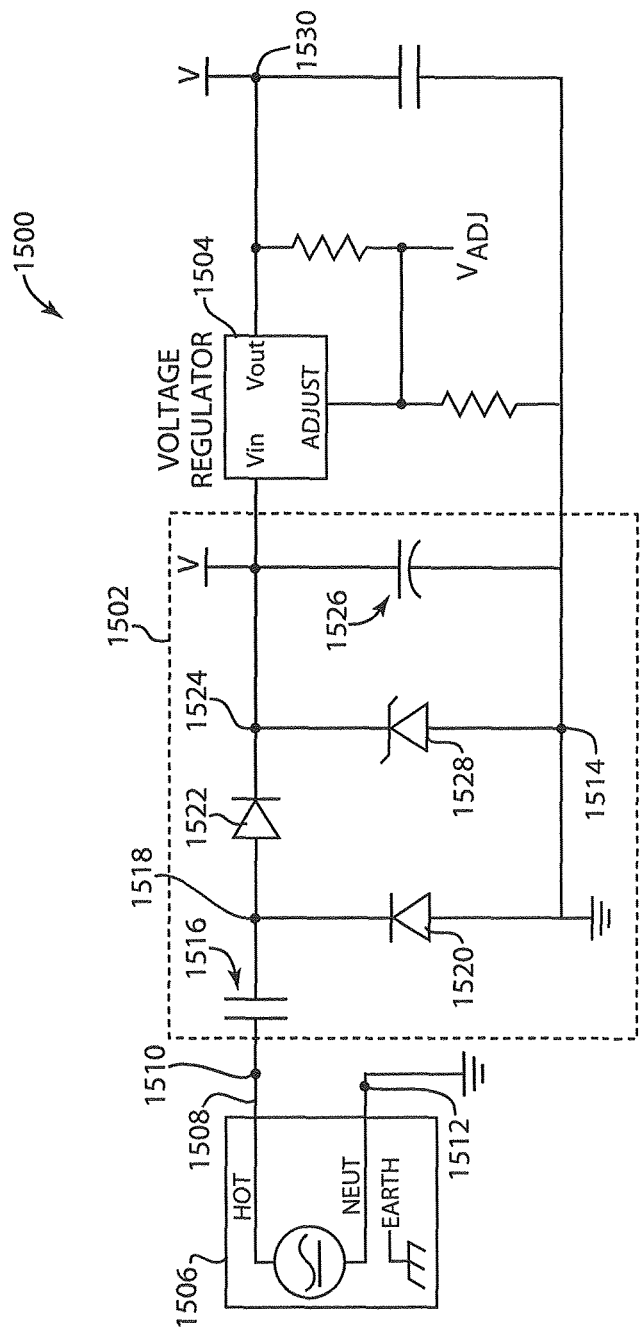
FIG. 15 is a schematic diagram illustrating an example power supply circuit suitable for some implementations of a sensing apparatus such as a gasket.

FIG. 15 is a schematic diagram illustrating an example power supply circuit 1500 suitable for some implementations of the sensing apparatus. Circuit 1500 includes a rectifier 1502 and a voltage regulator 1504 which collectively can generate DC power from an AC electric current. In some implementations, power supply circuit 1500 can be included in the platform circuitry of a gasket as described above, e.g., in DC power generation block 1040 of FIG. 10, for example.

Power supply 1506 is a power source to which the appliance connector is connected, such as an electrical socket of an outlet. The neutral connection 1512 of the power supply is coupled to the ground node 1514 of the circuit 1500. The hot connection 1508 from the power supply is coupled to an input node 1510 of the power supply circuit 1500, such as via any of the coupling implementations described above with respect to FIGS. 11-14.

Capacitor 1516 can be connected to couple input node 1510 to internal node 1518. The cathode of diode 1520 is connected to node 1518, and the anode is coupled to ground node 1514. The anode of diode 1522 is connected to node 1518, and the cathode is connected to output node 1524.

Output storage capacitor 1526 is connected between output node 1524 and ground node 1514. Zener diode 1528 is connected in parallel with capacitor 1526 with its cathode coupled to output node 1524 and its anode coupled to ground node 1514.

The rectifier circuit 1502 rectifies the input voltage at node 1510 and stores a DC charge on capacitor 1526. The charge on node 1524 can be used as a power source to drive all or a subset of circuits on the gasket. The Zener diode 1528 clamps the voltage at a predetermined level, thereby keeping node 1524 from going above a desired voltage level.

The output of rectifier circuit 1502 is provided to an input of a voltage regulator 1504. The output node 1530 of voltage regulator 1504 is a DC voltage that is used to power circuits on the gasket.

In other implementations of the rectifier circuit 1502, the operation is similar as described above except that the input voltage can be capacitively coupled from the conductors of the appliance connector. Some example embodiments of such a connection are described above with reference to FIGS. 13-14. In some capacitive-coupled implementations, a capacitor can be connected only between the hot connection and node 1518. In other implementations, a capacitor can be additionally coupled between the ground node and the neutral node.

Figure 16:
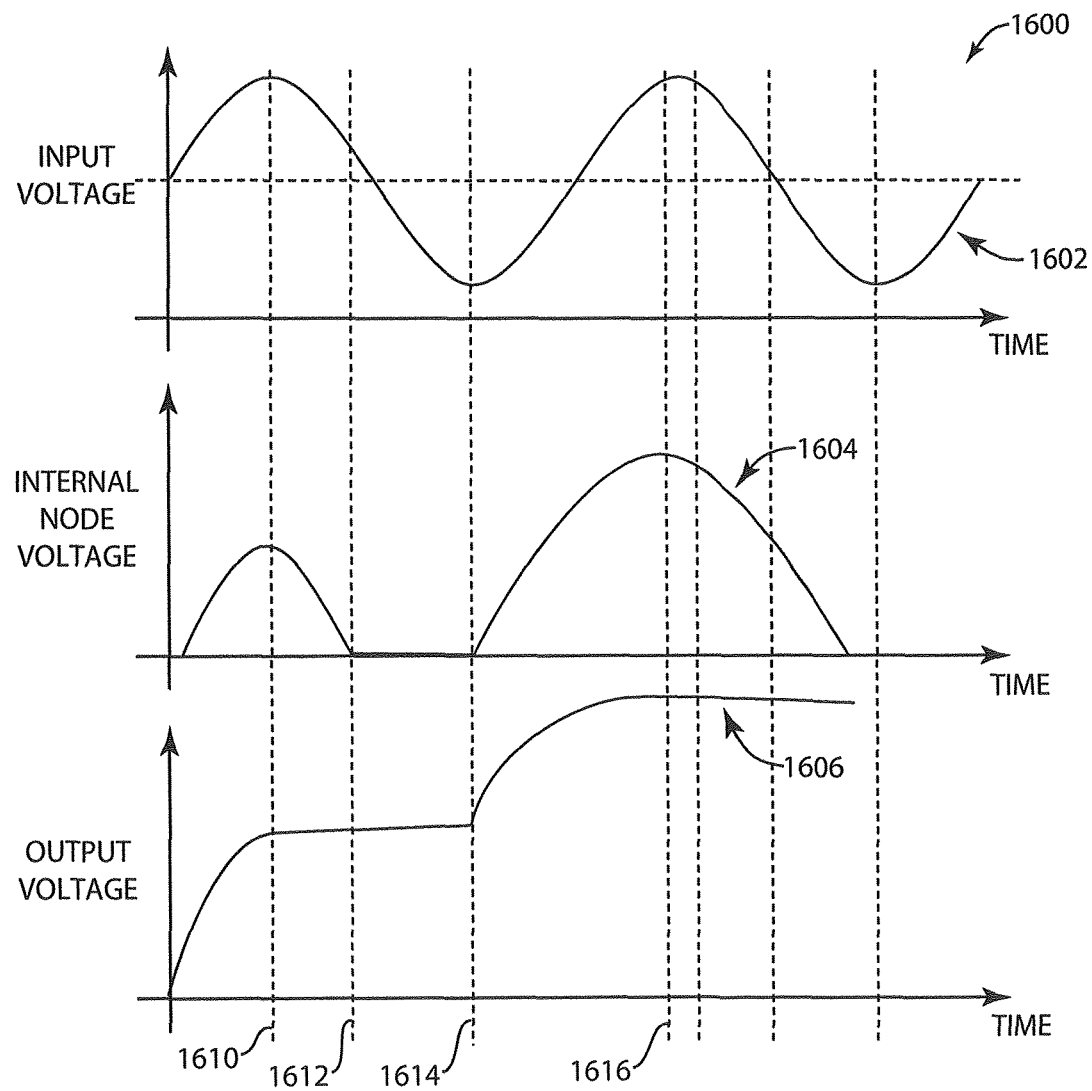
FIG. 16 is a diagrammatic illustration of the operation of the rectifier circuit example of FIG. 15.

FIG. 16 is a diagrammatic illustration 1600 of the operation of the rectifier circuit 1502 example of FIG. 15. The AC input voltage is represented by the sinusoidal waveform 1602. The internal node voltage at node 1518 is represented by waveform 1604. The output voltage at node 1524 is represented by waveform 1606. As waveform 1602 rises to a more positive voltage, waveform 1604 follows that voltage since it is coupled by capacitor 1516 of FIG. 15.

While the voltage on node 1518 is higher than the voltage on output node 1524, diode 1522 passes current. Therefore, waveform 1606 follows waveform 1604 to time point 1610. Beyond time point 1610, input waveform 1602 goes to a lower voltage. Waveform 1604 follows the voltage waveform 1602 since it is coupled by capacitor 1516. At this point, the voltage on node 1518 is lower than on node 1524, causing diode 1522 to no longer conduct current. Therefore, charge is trapped on storage capacitor 1526, maintaining a constant voltage at node 1524. These respective voltages are represented between time points 1610 and 1612.

At time point 1612, the voltage on node 1518 begins to go negative. This places diode 1520 into a state where it conducts current, thereby connecting node 1518 to ground 1514. For this reason, node 1518 is now maintained at ground level. Since the voltage on node 1524 remains higher than node 1518, diode 1522 remains non-conducting, and the voltage on node 1524 continues to remain constant. These respective voltages are represented between time points 1612 and 1614.

At time point 1614, input voltage at node 1510 begins to swing to more positive voltages again. The voltage on internal node 1518 is coupled high through capacitor 1516. Since the voltage on node 1518 is now higher than ground 1514, diode 1520 goes into a non-conducting state. When the voltage on node 1518 exceeds the output voltage at node 1524, diode 1522 goes into a conducting state, thereby bringing node 1524 to a higher voltage. This is the case until input voltage at node 1510 begins to swing low again, which in turn will cause node 1518 to swing low into a lower voltage than node 1524. Diode 1520 will now go into a non-conducting state, trapping charge on output node 1524. These respective voltages are represented between time points 1614 and 1616.

The above describes rectifier circuit operation over one period of the AC input voltage cycle. When charge is drawn from node 1524 to drive circuitry on the gasket, the voltage on node 1524 will drop as well. Device sizes can be chosen such that following periods of the AC input voltage replenish the charge that was consumed by circuitry on the gasket.

Figure 17:
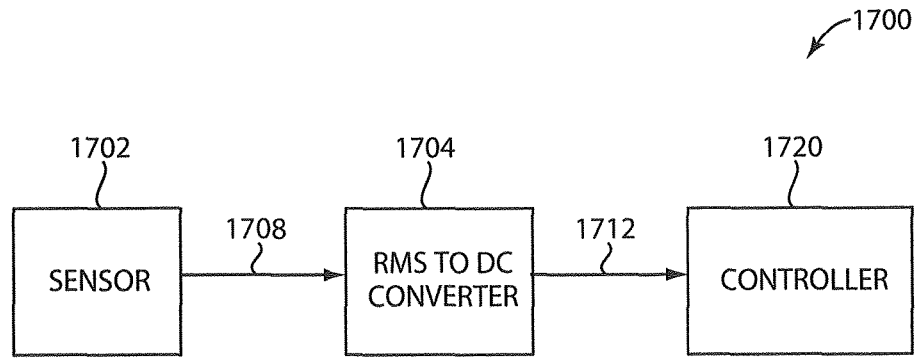
FIG. 17 is a block diagram of an example of circuitry which can be used in conjunction with one or more sensors.

FIG. 17 is a block diagram of an example of circuitry 1700 which can be used in conjunction with one or more sensors. In some implementations, one or more components of circuitry 1700 can be included in a sensor circuitry block of the gasket as described above for sensing current flowing through appliance prongs, e.g., in detection circuitry 1026 and/or data conversion block 1032 of FIG. 10. Circuitry 1700 can include a sensor block 1702 and a converter block 1704. The sensing circuitry 1700 can be used with a sensing ring implementation as described above, for example. Other appropriate sensing circuitry can be used with other types and implementations of sensors.

Sensor block 1702 can be used to sense a magnetic field caused by current flowing in the appliance connector. For example, a ferrite ring having a gap can be positioned around the hot opening in the gasket circuit board, as shown in the example of FIG. 10. Sensor block 1702 can include a magnetic Hall effect sensor positioned inside that gap. The concentrated magnetic field produced in the ferrite ring due to the electric current flowing through the hot conductor of the appliance connector results in a voltage on output 1708 of the Hall effect sensor. In an example implementation, a Hall effect sensor such as the A1362 from Allegro MicroSystems, Inc. can be used. The Hall effect sensor can produce a particular voltage amount for every amount of current through the hot prong. In some implementations, the hot prong provides an oscillating AC voltage, and the resulting Hall sensor current on output 1708 oscillates as well.

The oscillating voltage on sensor output 1708 can be converted to a DC voltage using converting circuitry in converter block 1704. For example, the output signal on output 1708 can be input to a RMS-to-DC converter chip in block 1704. An example of a RMS converter chip is AD536A from Analog Devices, Inc. In some implementations, root mean square (RMS) can be used as a measure of average electrical power and the converter can convert the AC input to a DC voltage proportional to the RMS. An output 1712 from block 1710 can output the resulting DC voltage. As the current through the hot prong increases, the magnitude of oscillating output signal on line 1708 increases, which results in a corresponding increase in SRMS voltage on output 1712. In this way, the voltage on output 1712 is a measure of the current drawn by the appliance, whose hot prong passes current through the ferrite ring in the gasket.

The output signal on output 1712 can be connected to a controller 1720, such as a processor as described above with reference to FIG. 4. In some non-limiting example implementations, an ATmega PCI18F26K20 8-bit microprocessor can be utilized. In some examples, the input analog voltage on line 1712 can be connected to a pin on microcontroller 1720 that connects to an analog-to-digital converter and generates corresponding internal digital data to process by the controller 1720. Other implementations can use one or more other types of processors, such as digital logic, ASIC, etc.

Figure 18:
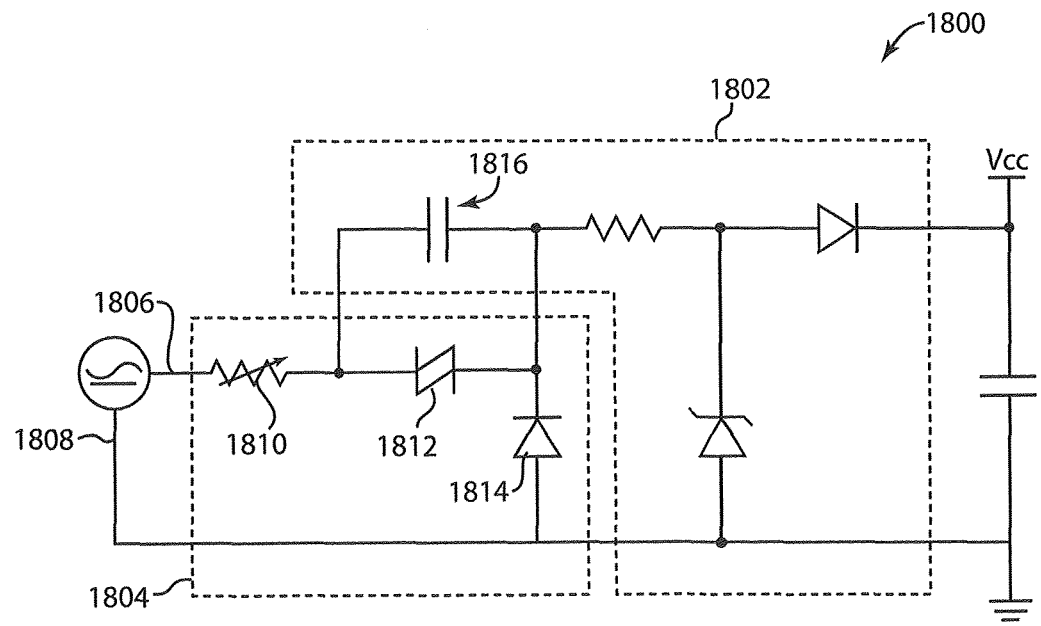
FIG. 18 is a schematic diagram of an example surge protection circuitry which can be used in some implementations of a sensing apparatus such as a gasket.

FIG. 18 is a schematic diagram of an example surge protection circuitry 1800 which can be used in some implementations of a sensing apparatus. For example, standard household power may have large intermittent spikes of short duration, which may exceed the maximum voltage tolerance of circuit components on the gasket, making them vulnerable to partial damage or failure. Surge protection circuit 1800 can reduce the vulnerability of such components. Surge protection circuitry 1800 can be implemented in a relatively small space and is suitable to be provided on compact gaskets. Some examples of surge protection are set forth in U.S. patent application Ser. No. 13/341,983, filed Dec. 31, 2011, which claims the benefit of U.S. Application No. 61/429,043 filed Dec. 31, 2010, all incorporated herein by reference.

Rectifier circuitry 1802 can include components similar to the rectifier circuit 1502 described above with reference to FIG. 15. Protection circuitry 1804 can be used to protect circuits on the gasket from power surges. Protection circuitry 1804 is connected between hot prong 1806 and the neutral prong 1808 of the appliance conductor, and can include three components connected in series in the described implementation.

The first component can be a thermistor 1810, which functions as a resettable fuse in the circuitry 1800. At room temperature, the series resistance of thermistor 1810 is low, e.g., typically less than about 3.8 ohms in some examples. As current through thermistor 1800 increases, its internal temperature rises, increasing its resistance exponentially. Therefore, an unusually high current through thermistor 1810 causes it to act like an open circuit or a blown fuse. When normal operation is restored, the thermistor 1810 returns to normal temperature, e.g., the fuse "resets" itself. The thermistor can be provided to withstand short voltage spikes, including spikes that are typically caused by lightning strikes. In some non-limiting examples, thermistor 1810 can operate normally at 450 mA and trip at 675 mA; during normal operation, less than 170 mA can flow through the thermistor 1810. An example of a suitable thermistor for some implementations is 0ZRA1000FF1A from Belfuse, Inc.

A second component of the protection circuitry 1804 can be a bidirectional TVS (transient voltage suppression) diode 1812. Bidirectional TVS diode 1812 can be connected in parallel with the coupling capacitor 1816. The bidirectionality of diode 1812 is not necessary for surge protection, but may be needed for proper rectifier operation. When the voltage exceeds a normal operating voltage in either positive or negative polarity, the bidirectional TVS diode 1812 conducts current through an avalanche breakdown mechanism, thereby limiting the voltage across the capacitor 1816. Thus, TVS diode 1812 can protect the coupling capacitor 1816 from over-voltage by shunting current around the capacitor. In some non-limiting examples, the diode 1812 can operate normally at 170 volts, limit voltage to about 182 volts or less, and can handle a surge current of up to 5 A. A non-limiting example of a bidirectional TVS diode is SMDJ170A from Littlefuse, Inc.

A third component of the protection circuitry 1804 can be a TVS diode 1814, which breaks down when the reverse bias exceeds a specified threshold, thereby conducting current and clamping the voltage to a specified level. In case severe faults occur elsewhere on the circuit board, the TVS diode 2333 can clamp the voltage on the rectifier to safe levels, protecting the power supply and sensitive circuitry. In some non-limiting examples, the TVS diode 1814 can start to break down at 6-7 volts and clamps the voltage on node 1818 to less than 10V at 50 A, where the maximum forward surge current that can be handled by the diode is 70 A.

Figure 19:
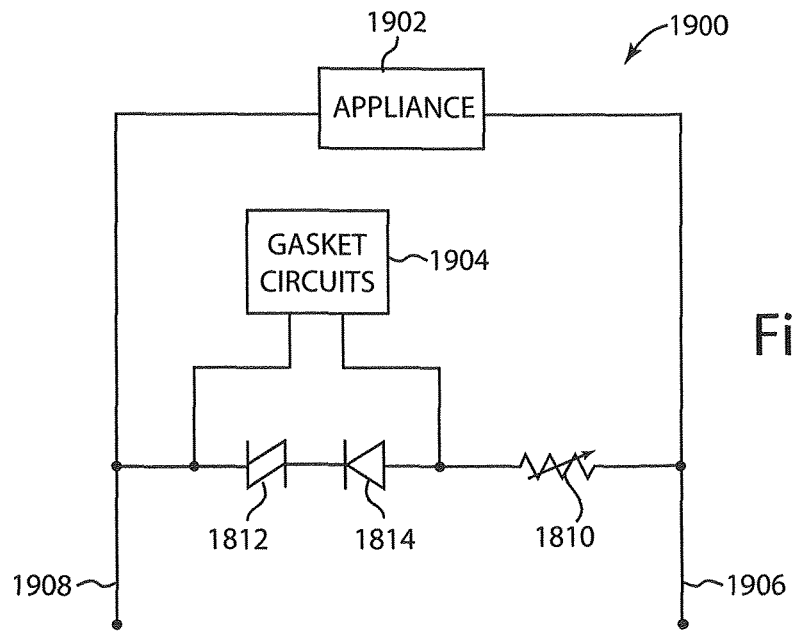
FIG. 19 is a schematic diagram of an example application of a surge protection circuit.

FIG. 19 is a schematic diagram 1900 of an example application of a surge protection circuit, such as circuit 1800 of FIG. 18. In some implementations, in addition to protecting the gasket circuitry, the surge protection circuit 1800 also can provide a measure of surge protection to an appliance connected to the appliance connector. The appliance 1902 can be connected between the same hot node 1906 and neutral node 1908 as gasket circuitry 1904. During a voltage spike, bidirectional diode 1812 and TVS diode 1814 reduce the voltage input into the gasket circuits that is the voltage between hot and neutral prongs. At the same time, thermistor 1810 decreases in resistance, thereby decreasing the current into the gasket circuits. During a short spike, the voltage between the two conductors is clamped since TVS diodes 1812 and 1814 react more quickly than thermistor 1810. During this interval of time, the connected appliance is protected due to the clamping of the voltage. However, in the case of longer spike duration, the thermistor 1810 will increase in resistance, thereby increasing the voltage between the prongs. At this point, the gasket circuits are protected but the voltage on the appliance 1902 is no longer clamped. In some alternative implementations, the thermistor 1810 can be placed in series with the appliance 1902 to limit the current, but this configuration may not be suitable for some gasket designs.

Figure 20:
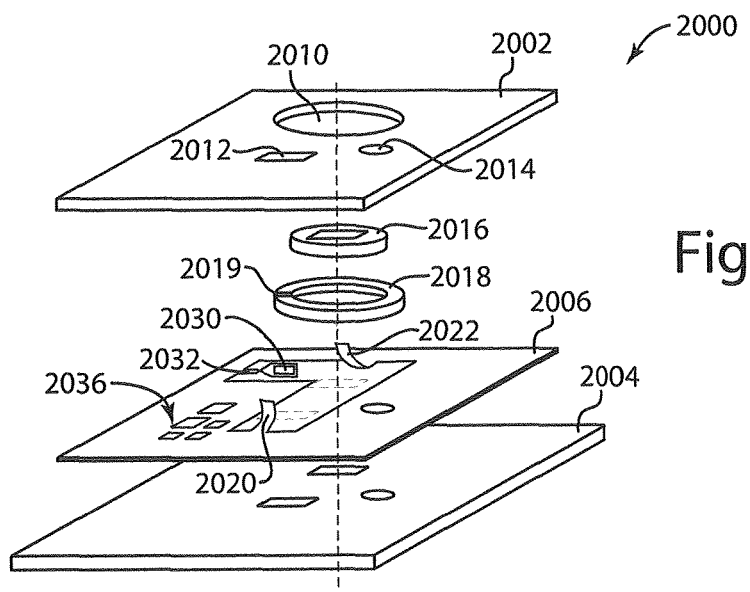
FIG. 20 is an perspective exploded view of an example implementation showing a physical construction of a gasket.

FIG. 20 is an perspective exploded view of an example implementation 2000 showing a physical construction of a gasket including one or more features described herein. In some implementations it is desired that the gasket be thin enough not to interfere with the mechanism that holds the appliance connector in the supply connector such as an electrical outlet. For example, a thickness for the gasket in some implementations can be about 3 mm. In another example, the thickness can be greater than 3 mm and sufficiently thin to allow an appliance connector to connect physically and electrically with its mating connector. Some implementations can also provide the gasket with a cross-sectional area that can fit within the surface area of the appliance connector such as a standard AC plug.

In a described example, the gasket can include a top molded plate 2002 and a bottom molded plate 2004 of a housing, with a flex circuit board 2006 positioned between these plates. The top and bottom plates can be made of plastic or other insulating material, for example. Top plate 2002 can include an opening 2010 at a relative location of a hot prong of an appliance plug, an opening 2012 to receive a neutral prong, and an opening 2014 to receive a ground prong. A spacer 2016 can include an opening sized to the hot prong and can be surrounded by a ferrite ring 2018 having a gap 2019. The spacer 2016 and ring 2018 can be inserted in the opening 2010 of the top plate 2002.

Flex circuit board 2006 can include a terminal or flap 2020 positioned for the neutral prong and a terminal or flap 2022 positioned for the hot prong of the appliance connector. Flaps 2020 and 2022 can be coated with a conductive material and extend beyond the ferrite ring 2018 into the opening receiving the respective prongs. The ferrite ring 2018 can be coated with a dielectric, thereby avoiding electrical contact with flap 2022. In this manner, flap 2022 can act as a contact brush to contact the hot prong while flap 2020 can act as a contact brush to contact the neutral prong. The flex board material can be sufficiently flexible to bend as the prongs are inserted into the gasket openings, and sufficiently rigid to snap back into their neutral positions when the gasket is removed from the appliance plug.

A Hall effect sensor 2030 can be mounted on a flex board flap 2032, which can be twisted by 90 degrees as shown to be positioned inside the gap 2019 of ferrite ring 2018. Circuitry 2036 can be surface mounted on one or both sides of flex board 2006. The sides of top plate 2002 and bottom plate 2004 that face towards the flex board 2006 can be molded precisely to match the contour of the circuitry. For example, when pressed together, top plate 2002 and bottom plate 2004 can snap together with an interlocking mechanism on the edge of the gasket, holding in place flex board 2006, spacer 2016, and ferrite ring 2018.

FIG. 21 illustrates an example of a top view of an implementation of the flex circuit board 2100 similar to the implementations shown in FIG. 20. Flex circuit board 2100 is a substrate which can be very thin (compared to regular FR4 printed circuit boards) and flexible, and on which circuit components can be mounted. The thickness of the flex circuit board can depend on material choices and the number of metal layers used. In addition, the flex board can be integrated into an injection molding fabrication process.

The outline of the flex board 2100 can be made to match the cross-sectional shape of a standard appliance plug, where in the example 2100 the board can be similarly-shaped to the wedge-shaped plug and gasket shape shown in FIG. 5. Opening 2102 and the opening 2104 can receive the neutral prong and earth ground prong of the adaptor connector, respectively. The hot prong of the adaptor connector can fit through the opening 2105. A Hall effect sensor 2107 can be located on flap 2106. The cut-out area 2108 of the flex board can be used to position a gapped ferrite ring 2110. Some examples of a ferrite ring 2110 are described below with reference to FIGS. 22A and 22B.

Examples of various other components are also shown on flex board 2100 in examples of FIG. 21. Rectangular ferrite structure 2110 can be placed in the cut-away area 2108 of the circuit board 2100 such that the gap 2112 aligns with Hall effect sensor 2107 on flap 2106. In some implementations, flap 2106 can be folded along line 2120, thereby turning the surface of Hall effect sensor 2107 perpendicular to ring gap 2112. A surface-mounted microcontroller 2122, transceiver 2124, antenna chip 2126, and discrete circuit components can be mounted in the space available on flex board 2100.

Antenna chip 2126 can be space efficient and may require no ground plane. One non-limiting example of a suitable antenna chip is 1450AT43D100 from Johanson Technology, Inc. In some implementations, a less expensive antenna can alternatively be formed by using conductive traces on the flex board 2100. Two antenna designs 2130 and 2132 are shown as examples. In some implementations, such alternative antennas may cause the size of the gasket to be increased beyond the size of a standard plug.

In other implementations, silicon chips can be mounted directly on an insulating substrate, e.g. using a technique called chip-scale packaging. Alternatively, Micro-Electro-Mechanical Systems (MEMs) can be used to produce the ferrite ring functionality and gasket the circuitry. In some implementations, organic electronics can be used to construct the circuitry through a sequential process of printing layers of functional dielectric, conductive, and semiconductor inks on thin flexible plastic or fabric substrates. Some implementations can produce gasket circuits by encapsulating the circuits in plastic or constructing circuitry between two molded plastic plates. Alternatively, the gasket boards can be encapsulated directly into an appliance connector.

Figures 22A, 22B:
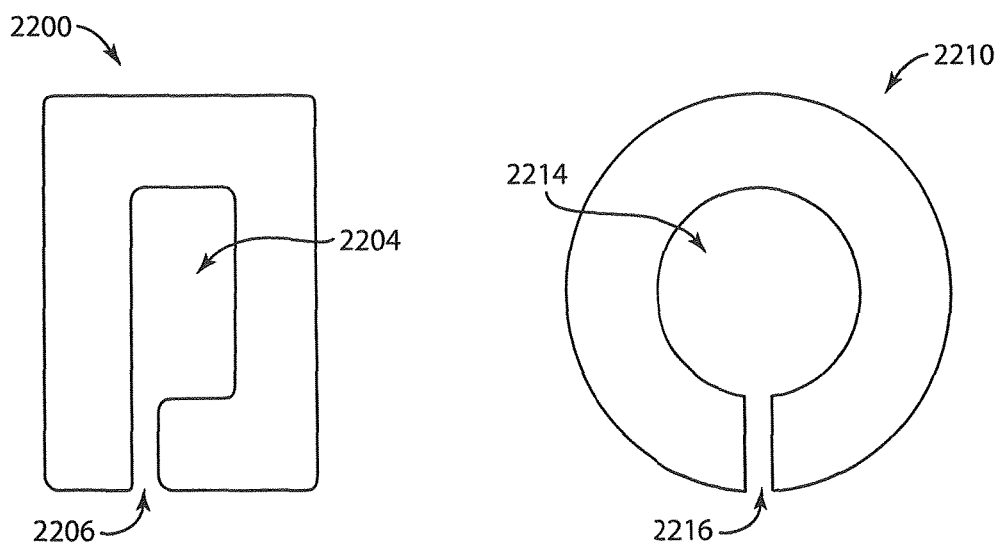
FIGS. 22A and 22B are top views of illustrating example implementations of a ferrite ring that can be used in some implementations of a sensing apparatus such as a gasket.

FIGS. 22A and 22B are top views illustrating example implementations of a ferrite ring that can be used in some implementations of the sensing apparatus described above, such as a sensing gasket. In FIG. 22A, a rectangular ferrite ring 2200 is shown. For example, the opening 2204 in the ring 22200 can be made large enough to accommodate a hot prong (or other appropriate prong) of the appliance connector. In one non-limiting example, the opening can be at least about 7 mm long (longest dimension) and 4 mm wide, and the gap 2206 in ring 2200 can be about 1 mm and long enough to fit a Hall effect sensor. In FIG. 22B, an example of a circular ferrite ring 2210 is shown, which can be similar to other circular ferrite rings shown above in some implementations. Similarly as for ferrite ring 2200, the circular ferrite ring 2210 can include an opening 2214 made large enough to accommodate an appropriate prong of the appliance connector (e.g., about 7 mm diameter in some non-limiting examples), and the gap 2216 made large enough for a Hall effect sensor. In some implementations, the rectangular ferrite structure 2200 may be more efficient in terms of space allocation than a circular ferrite structure 2210.

Figure 23:
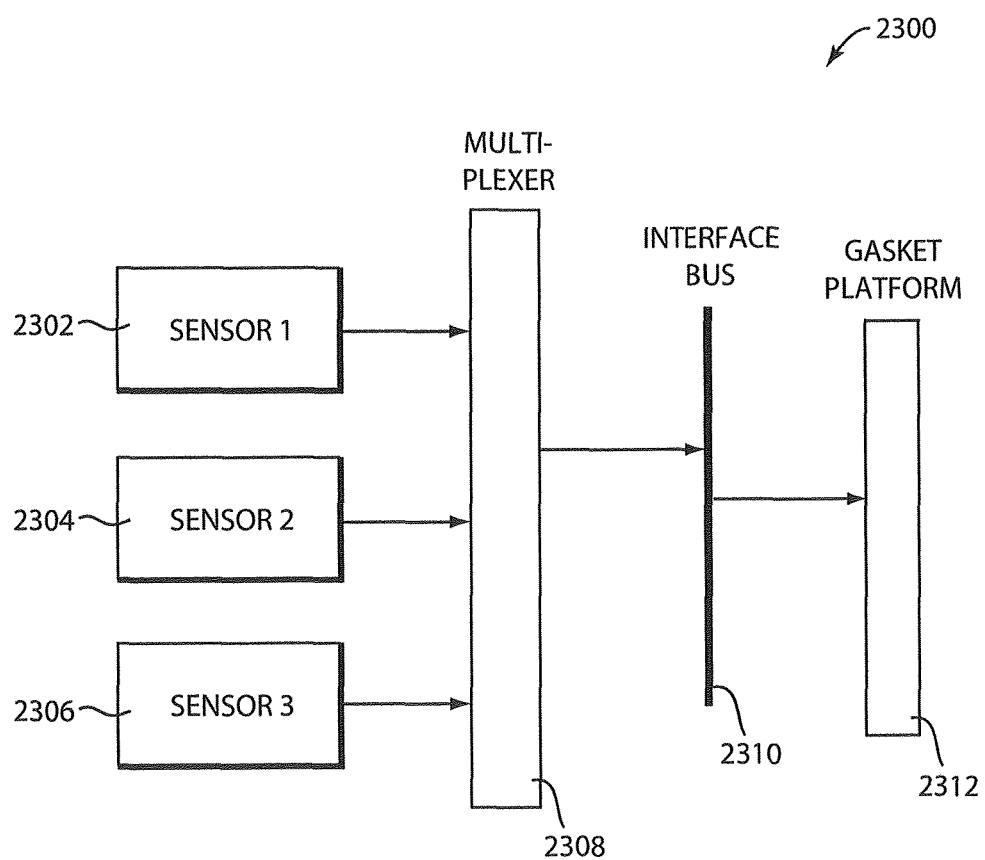
FIG. 23 is a block diagram illustrating an example implementation of a gasket in which multiple sensors are connected to the gasket.

FIG. 23 is a block diagram illustrating an example implementation 2300 of a sensing apparatus, such as a gasket, in which multiple sensors are connected to the gasket. Gasket 2300 is connected to three different sensors 2302, 2304, and 2306. The sensors are connected to a standard interface bus 2310 through a multiplexer 2308. The interface bus 2310 is coupled to the gasket platform 2312 (such as a gasket circuit board). For example, in some implementations the multiplexer 2308, interface bus 2310, and gasket platform 2312 (such as a circuit board) can be provided within the housing of the gasket while one or more of sensors 2302-2306 are separate from the gasket and coupled to the gasket via a connector such as shown above for FIGS. 7-9. One of more of such sensors can be made interchangeable such that the sensor can be disconnected and a different sensor and/or sensor type can be connected to the gasket circuitry. In some embodiments, one or more of the sensors 2302-2306 can be included in the gasket housing, e.g., sensor types that are useful for a wide array of applications.

In some implementations, the multiplexer 2308 can be used to select one of the sensors 2302-2306 from which to receive sensor data for processing at any given interval in time. For example, sensor 2302 can be read and processed during a first interval of time, sensor 2304 can be read and processed during a second interval of time, and sensor 2306 can be read and processed during a third interval of time. At the fourth interval of time, sensor 2302 can be read and processed again, and so on. This concept can be expanded to n sensors, where n intervals of time are sequentially read and processed, and where the resulting read frequency of any one sensor is sufficiently high to achieve the read resolution desired.

Figure 24:
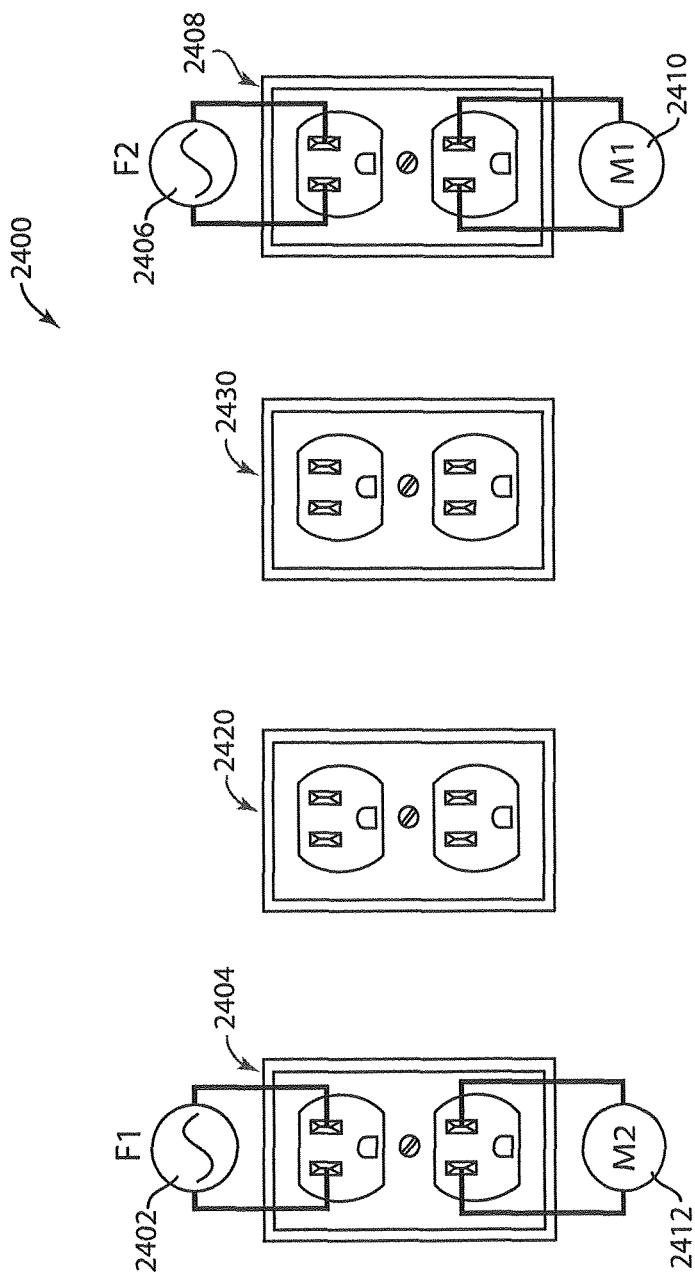
FIG. 24 is a diagrammatic illustration of an example implementation of a system that can be used to identify sensing apparatus location.

FIG. 24 is a diagrammatic illustration of an example implementation 2400 of a system that can be used to identify physical location of a sensing apparatus such as a gasket. In some applications, the location of a gasket is desired to be known in order to, for example, attribute one or more geographic attributes to the sensor data that is collected. In some implementations, one or more gaskets are associated with specific power outlets and do not move from their locations in standard operation.

In the example system of FIG. 24, a first tone generator 2402 can be plugged into an outlet 2404 that represents an outlet on a first designated end of a local power grid. The first tone generator 2402 can generate a first signal having a tone frequency F1 on the power outlet circuit. A second tone generator 2406 is plugged into an outlet 2408 that represents an outlet at a second designated end of the local power grid, and can generate a second signal on the power outlet circuit having a tone frequency F2. A monitor 2410 can be connected to the outlet 2408 at the second end (e.g., in a different socket of the outlet 2408) and can monitor the amplitude of the first signal generated by the first tone generator 2402, where the amplitude of the first signal is set such that monitor 2410 is within an easily readable range of first tone generator 2402. Similarly, a monitor 2412 can be connected to the outlet 2404 at the first end and can monitor the amplitude of the second signal generated by the second tone generator 2406, where the amplitude of the second signal is set such that monitor 2412 is within an easily readable range of second tone generator 2406.

Given these initial conditions, the first and second signals attenuate to various levels at each power outlet connected to the power grid, depending on the resistance of the wire between the source of the signals and any given outlet. For example, the signal amplitudes at outlet 2420 are characterized by a unique set of amplitudes of the first and second signals, and the signal amplitudes at outlet 2430 are characterized by a different set of amplitudes of these signals. Thus, each power outlet can be correlated to a particular set of amplitudes that is mapped to a particular physical location of the power outlet. In response to a gasket being inserted into a given outlet, circuitry on the gasket platform can read the signal amplitudes of the first and second signals at that outlet, and can transmit these amplitudes along with an identifier for the gasket, such as an assigned IP address, serial number, and/or the MAC address of the gasket. Based on this information, a data collector or server can map a gasket with a given identifier to a particular outlet at a known location. In some implementations, the system can also or alternatively be designed to utilize the phase shifts at a given outlet relative to tone generator 2402 and tone generator 2406 to identify a particular outlet and its location.

Other implementations can also associate a gasket identifier (e.g., IP address or MAC address) with the location of a specific outlet. In some implementations, the physical location of the gasket can be determined by a receiving device (such as a data collector or server) based on received sensor data. In some examples, one or more geographic attributes can be assigned to sensor data that is collected. For example, each gasket can be associated with a specific outlet receptacle 14 or other receptacle, and may be typically stationary in some implementations. Thus, a gasket IP address and/or MAC address can be associated with the location of a specific outlet when the gasket and plug are plugged into that outlet. Thereafter, the association of an IP address or MAC address can be associated with a specific physical location. One way that this can be accomplished is to make this association manually. Specifically, when the gasket is plugged in, a user can associate the gasket's outlet location with a known MAC address of the gasket or an assigned IP address of the gasket. In some implementations, this association can be automated by connected software or device to avoid potential errors that may occur when a gasket is unplugged from one outlet and plugged into another without making the corresponding changes to the associated physical location. Thus, if a user or receiving device has kept track of the location where a given gasket was placed and the particular appliance(s) connected to it, then the data received from the gasket can be associated with the location at which it was obtained and with the appliance pertinent to the measurements.

In some implementations, location circuitry can be included in a sensing apparatus, such as a gasket, to assist in determining the geographical or physical location of the gasket. The location circuit can receive location signals from one or more sources and provide location information indicative of a physical or geographical location of the gasket. The location information can be transmitted by the transmitter to a receiving device such as a data collector or server. For example, in some implementations, global positioning system (GPS) co-ordinates can be used to identify the physical location of the outlet into which a gasket is plugged. In some examples, this can be accomplished by including a small GPS receiver chip within or connected to the gasket. Location information indicating the GPS-determined location of the gasket can be transmitted from the gasket to a receiving device. An example of such a chip having small size is the GNS7560 receiver chip from NXP Semiconductors. In some other examples, a ZigBee™ RTLS (Real Time Location System) can be utilized for the purposes of automatically mapping gaskets to their physical location. For example, an RTLS chip or circuit can be included in the gasket circuitry in some implementations. Either on demand or periodically, this chip can take measurements of time of arrival (TOA) or received signal strength (RSSI) from nearby reference sensors, whose locations are known. These measurements can be included in a data packet transmitted from the gasket to a receiving device (data collector or server). Software such as a location engine, e.g., residing on the data collector 16 or centralized server 18, can calculate the location of the gasket based on the TOA and RSSI data, along with known distances to and locations of the reference sensors. The resulting location can then be associated with the gasket's IP address or MAC address. An example of an RTLS locator chip is CC2431 from Texas Instruments Inc.

Figure 25:
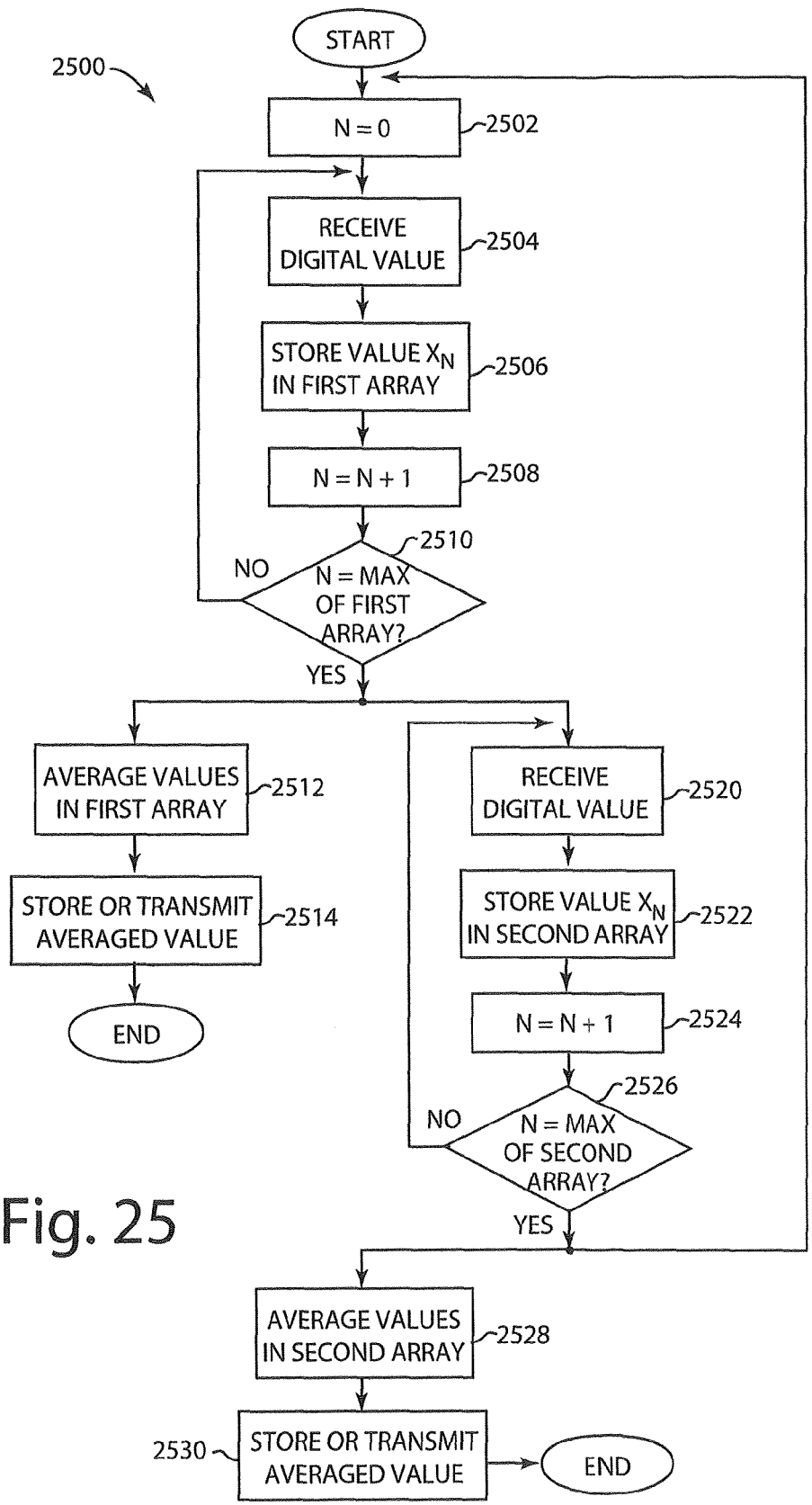
FIG. 25 is a flow diagram illustrating an example method of processing digital sensor values by sensing apparatus circuitry.

FIG. 25 is a flow diagram illustrating an example method 2500 of processing digital sensor values by circuitry of a sensing apparatus such as a sensing gasket. For example, the sensor values can be provided in a digital data signal provided from a sensor and/or other circuitry and received by one or more processors of the gasket such as the controller 420 shown in FIG. 4, and the processor(s) can implement process 2500. Instructions for the processor to implement the process may be stored, for example, in the memory 422 or other available storage.

In some implementations of method 2500, discrete digital RMS values are received as a function of time and are stored in a double buffered array, and the values are processed to reflect a unit of energy consumed per unit time. In the implementation described in FIG. 25, a first set of received sensor values are buffered and then averaged to a resulting average value that is transmitted, and a second set of the next received sensor values are similarly buffered while the first set is being processed and transmitted, where the second set is to be averaged and transmitted similarly to the first set. In other implementations, a single array can be used to store received and/or processed sensor data.

Some implementations can receive an analog RMS input signal from sensor circuitry and convert the analog signal to a digital value with a sample and hold circuit and analog-to-digital converter, as described above for FIG. 4. For example, the sample and hold circuit 444 can trigger intervals controlled by the clock generator 414. In one non-limiting example, the clock can trigger a sample and hold event every 1 millisecond.

In step 2502, a count variable N is initialized to zero. In step 2504, a digital value is received, e.g., from an analog-to-digital converter. In step 2506, the digital value $X_N$ is stored in a first array. For example, the array can be implemented in memory 422. In step 2508 the count variable N is incremented. In step 2510, the process checks whether N has reached a maximum count value for the first array. For example, the first array can have a maximum count value of N=16 in some implementations (for holding 16 values in the first array), or some other value depending on the desired amount of stored values to average at one time. If N has not reached the maximum count value, then the process returns to step 2504 to receive another digital value.

If N has reached maximum count value, then the process can simultaneously continue to steps 2512 and 2520. In step 2512, the stored values in the first array are averaged. In some implementations, the values can be averaged using a moving average method or algorithm. For example, the following average formula can be used:

$$CA[i+1]=X[i+1]+(i*CA[i])/i+1$$

where CA is a moving cumulative average, X is a value, and i is a count variable incremented for each value in the array. This type of average can reduce the amount storage space required in determining an average from stored values. Other averaging methods can be used in other implementations.

After step 2512, step 2514 transmits the averaged value using a transceiver, such as a wireless transmission to a data collector 16 or server 18. In some implementations, the averaged value can be stored (e.g., in a third array) until a predetermined number of averaged values have been determined, and then the predetermined number of values can be transmitted together in a single transmission event every predetermined time interval. The amount of values stored can be based on the specific implementation. This branch of the process then ends for the current iteration.

Once N has reached maximum count value as determined in step 2510, then the process also performs another branch in which a second array is used to store the next set of received values. The process can continue from step 2510 to step 2520 at the same time that the process is averaging the values stored in the first array in step 2512, or at a different time in alternate implementations. In step 2520, a digital value is received, and in step 2522, the digital value $X_N$ is stored in a second array that can be implemented in memory 422, for example. The second array can be the same size as the first array in some implementations. In step 2524, the count variable N is incremented, and in step 2526 the process checks whether N has reached a second maximum count value associated with the second array. In some implementations, the second array can have a maximum count value that is double the maximum count value of the first array, e.g., a maximum count value of 32 in implementations in which the first array maximum count value is 16. If N has not reached the maximum count value, then the process returns to step 2520 to receive another digital value. If N has reached the second maximum count value, then the process can simultaneously continue to steps 2528 and 2502. In step 2528, the stored values in the second array are averaged, e.g., similarly as the values in the first array as described above. In next step 2530, the averaged value can be stored or transmitted using a transceiver similarly as the averaged value in step 2514. This branch of the process then ends for the current iteration. Furthermore, once N has reached maximum count value as determined in step 2526, then the process also returns to step 2502 to reset the counter N and to begin storing values in the first array. Thus the process can continue from step 2510 to step 2520 and store values into the second array at the same time that the process is averaging the values stored in the first array in step 2512, and similarly store values in the first array while averaging values in the second array. In this manner, data can be processed from one of the two arrays while new data is stored in the other array. In some implementations, fewer or additional arrays can be used.

The resulting averaged data values can be transmitted (e.g., in a data packet) along with other information to a data collector 16 or server 18. The data values can be processed on the data collector or server to determine the sensed condition. For example, in the implementations described above the data values represent sensed current consumption by the appliance as measured through the appliance connector. A server can, for example, take the square root of the value and multiply by a unit conversion factor, with the result representing an average amount of energy used per unit time over the predetermined time interval between each transmission by the gasket. The resolution of measurement can be adjusted to a desired level by altering the number of data values with which a single averaged data value is calculated. For example, by storing fewer measurements $X_N$ in the array and then calculating the moving average value, the resolution of energy measurement is increased at the expense of requiring more data to be transmitted from the gasket, and vice versa.

In some non-limiting implementations of the sensing system used for sensing power consumption of appliances, the data collector or server can obtain a sensor value every predetermined time interval, such as 1 ms. The gasket, data collector or server can subtract the contribution of a DC operating voltage of each data value from each value or use differential analog-to-digital inputs on a processor. Each value can be squared and added to a previous total, and the total can be set to zero every longer time interval, such as 1 minute, resulting in N measurements each longer time interval. For example, the number equal to the square of the N measurements can be transmitted to a data collector or server each longer time interval. After transmission, the number can be squared to provide an average RMS value over 1 minute. The average number can be multiplied by an appropriate scaling factor to provide the amount of power consumed in a desired unit of measurement.

Figure 26:
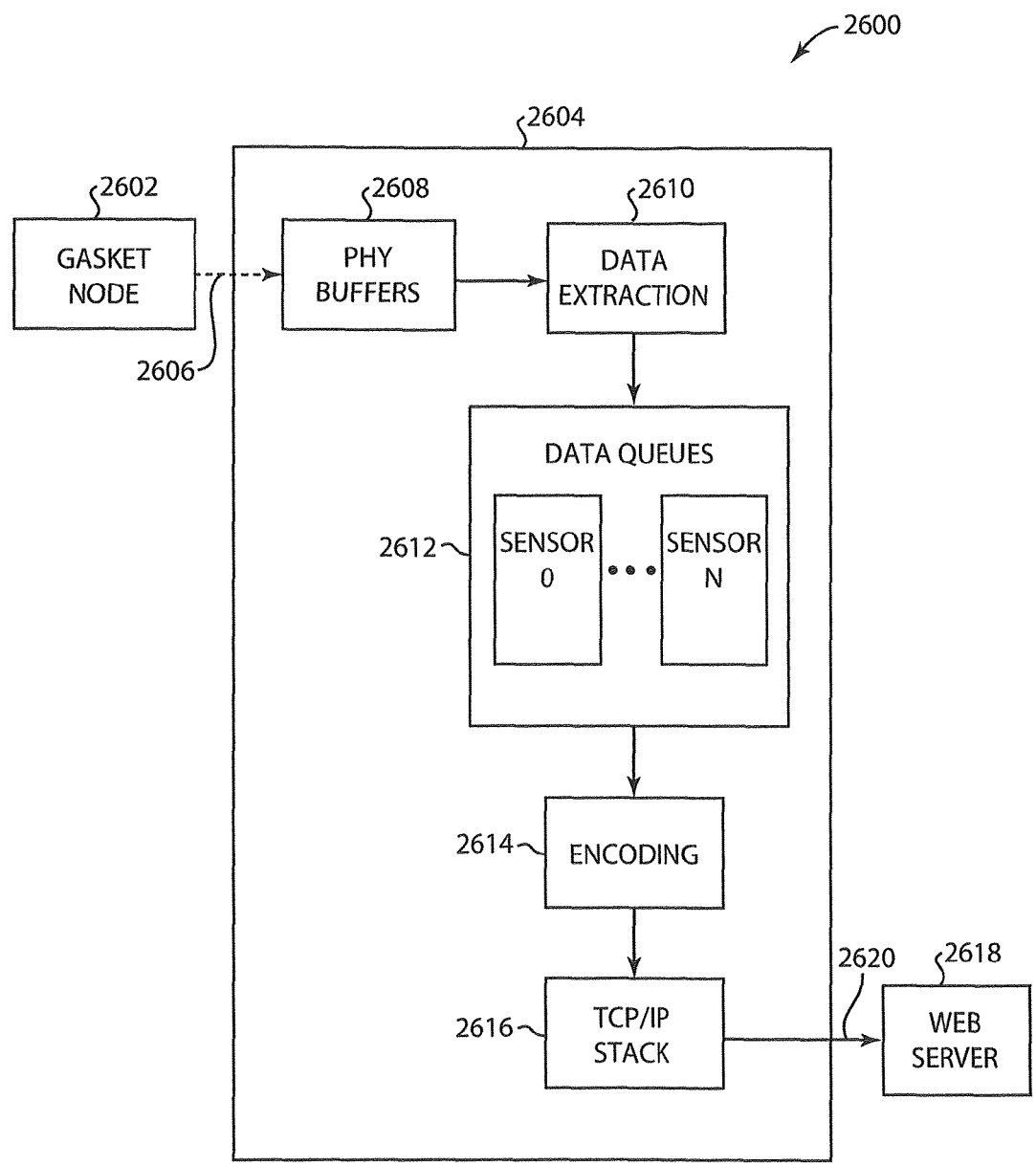
FIG. 26 is a block diagram illustrating another example system implementation including one or more features described herein.

FIG. 26 is a block diagram illustrating another example system implementation 2600 including one or more features described herein. A gasket at sensing network node 2602 can be one of multiple gaskets in the system, and can send sensor data and other information to a data collector 2604 via a wireless communication link 2606. In some examples, the information can be sent via a Zigbee protocol or other protocol as described above to a Zigbee collector used as data collector 2604. In an example implementation, the data collector can serve as a network coordinator and start up a wireless sensor network such as a Zigbee network by broadcasting a network beacon. The sensing gaskets can then, in this example implementation, request to join the network based on a network identifier in the broadcast that specifically identifies the network (such as a PAN (Personal Area Network) ID for a Zigbee network). The data collector can add each sensing gasket to a network list, and the gaskets can send data directly to the data collector MAC address via the sensor network.

In the example of FIG. 26, the data collector 2604 includes PHY buffers 2608 which receive the sensor data and other information as data packets and buffers the information. The data collector 2604 can include a data extraction block 2610 for receiving the data packets from the buffers and extracting information therefrom, such as the MAC address of the gasket (and/or other identification) and any other header or data packet information. The information can be sent to data queue block 2612 in the data collector which can provide a queue for each sensing gasket that is sending data to the data collector such that the data packets are stored in the queue corresponding to the sending gasket. The queues can continue to store received sensor data until a sufficient amount is received. The data collector can include an XML encoding block 2614 to receive and encode the queued information into an XML format, or similar format which can be used by a server. A TCP/IP stack 2616 can receive the encoded information and store the information for sending via the TCP/IP protocol.

When ready, the data collector 2604 can send out the encoded information from the TCP/IP stack 2616 over a network link 2620, such as a link of a wireless network or a wired network (e.g., Ethernet). One or more servers 2618 can each be an internet web server or other type of server that receives the information, and can allow access to the information from users that can log into or otherwise access the server's website or data via a network. In some example implementations, a wireless network such as WiFi™ (802.11 standard) can be used for communication between the data collector 2604 and server 2618. In some implementations, wireless communications can require an initial setup pairing the data collector to a WiFi Internet router (not shown). For example, a wireless network SSID and optional security key (e.g. WEP, WPA2) can be input into the data collector's non-volatile memory. The data collector can then send sensor data to a dedicated web server over the Internet.

Figure 27:
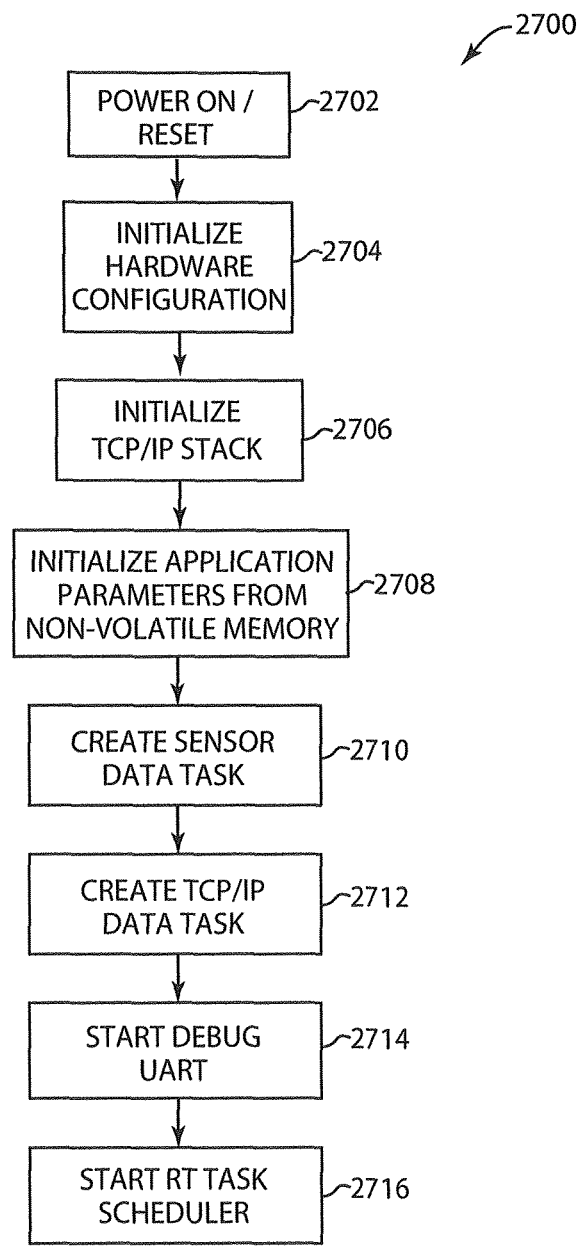
FIG. 27 is a flow diagram illustrating an example method which can be implemented by a data collector.

FIG. 27 is a flow diagram illustrating an example method 2700 which can be implemented by a data collector to receive sensor data and convey such data to a data processor such as a server. For example, the data collector can be a data collector 4, 16, or 2604 as described with reference to FIGS. 1A, 1B, and 26, respectively. In some implementations, one or more of the steps of method 2700 can be implemented as states in a state machine implementing a main task that is terminated after starting a scheduler. The example of FIG. 27 can use a device such as a Zigbee device as an example data collector. Other types of devices can be used in other implementations.

In step 2702, a power on or reset state of the data collector is initiated. In step 2704, a hardware configuration of the data collector is initialized. In step 2706, a TCP/IP stack is initialized (if using such a protocol; other protocol types of stacks can also be used and initialized). In step 2708, the data collector initializes application parameters from non-volatile memory, such as default and/or user-specified parameters governing sensor data collection and sending data to servers. In step 2710, a sensor data task is created, such as a Zigbee task in some implementations. This task can govern the collection and communication of data from and to sensor apparatus such as one or more gaskets. In step 2712, a networking task is created, which governs the communication operation between the data collector and a server. In step 2714, some implementations can start a debug UART (universal asynchronous receiver-transmitter) for allowing debugging commands to be provided to the data controller by a user or administrator. In step 2716, an RT (real time) task scheduler can be started, to allow quick scheduling of tasks and responses based on real-time events such as the arrival of sensor data.

Figure 28:
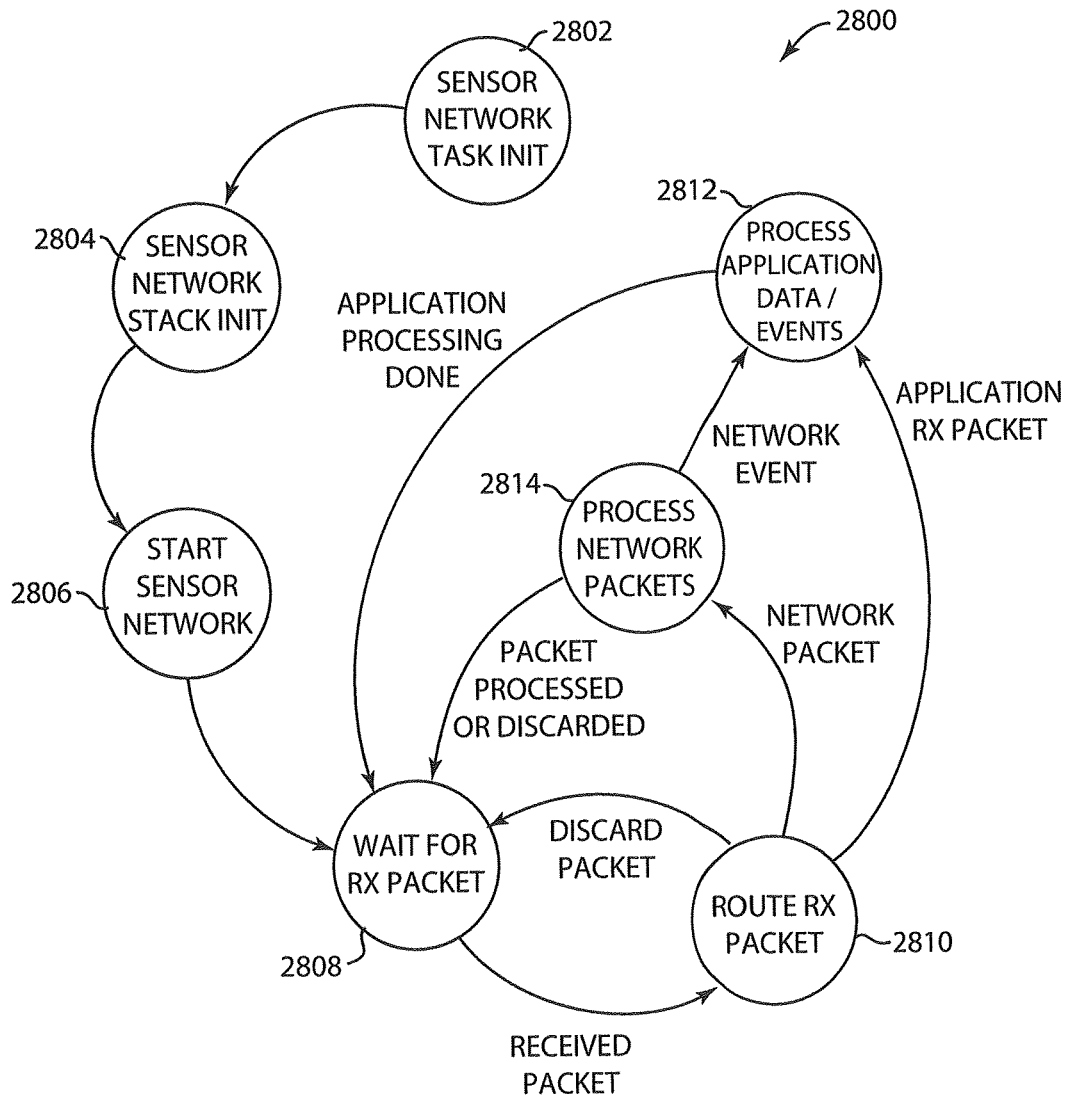
FIG. 28 a state diagram illustrating example states for a data collector or server managing a sensor network and queuing sensor data.

FIG. 28 is a state diagram illustrating example states 2800 for a data collector or server managing a sensor network and queuing sensor data. In some implementations, firmware, software, or circuitry of a data collector or server can implement one or more state machines which can implement the states 2800. In some implementations, the sensor network can be a Zigbee wireless network or other type of network.

A task initialization state 2802 can initially be entered to start tasks for receiving and sending sensor data packets on the sensor network, followed by a stack initialization state 2804 for initializing a stack related to receiving sensor data packets. In next state 2806 the sensor network is made active to allow reception and sending of data over the sensor network. In state 2808 the device waits for an received (RX) sensor data packet to be received. If a packet is received, state 2810 is entered, which examines the packet and routes it appropriately. For example, the packet is discarded if it is not relevant for these operations, and state 2808 is re-entered. If the packet is an application RX packet, the state 2812 is entered to process application data or events, and when done the state 2808 is re-entered. If the packet is a network packet, the state 2814 is entered to process the network packet, such that the packet is processed or discarded and state 2808 is re-entered, and/or a network event is initiated and state 2812 is entered to process application data and/or events.

Figure 29:
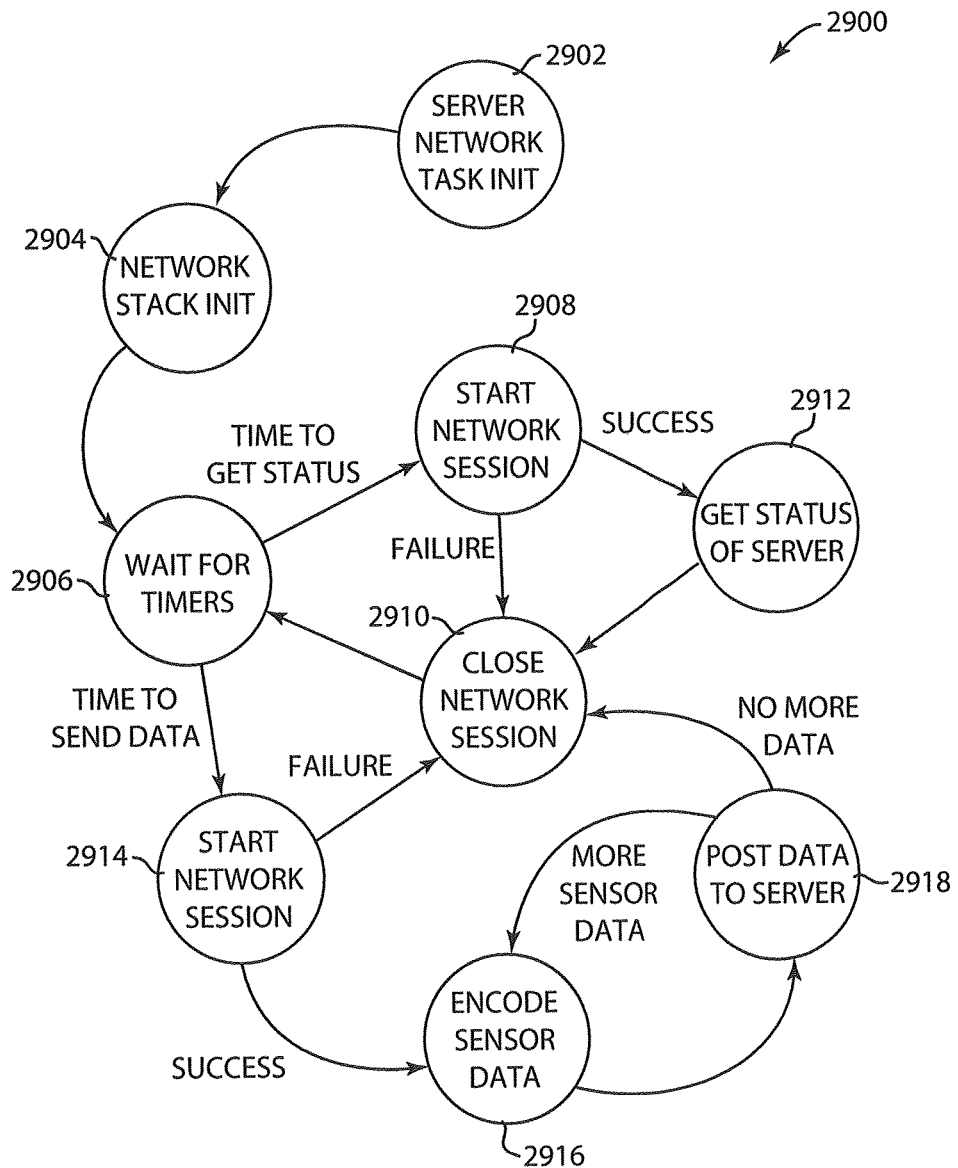
FIG. 29 is a state diagram illustrating example states enabling network tasks to send data to a server.

FIG. 29 is a state diagram illustrating example states 2900 enabling network tasks for a data collector (or other device) to send data to a server. In some implementations, the network tasks can include TCP/IP tasks if using that protocol, for example, and can include creation of encoded data (such as XML encoded data) and sending of the data to a server over a network. In some implementations, firmware, software, or circuitry of a data collector can implement one or more state machines which can implement the states 2900.

A task initialization state 2902 can initially be entered to start tasks for receiving and sending data to the server, followed by a stack initialization state 2904 for initializing a stack related to network communication. In next state 2906, the state waits for timers to expire. If a timer related to getting status expires, then state 2908 is entered in which a network session is attempted with the server, such as an SSL (secure sockets layer) session. If the data collector fails to start a network session, state 2910 is entered, in which the network session is closed and state 2906 is re-entered to wait. If the network session succeeds, state 2912 is entered, in which the status of the server is received via the session link, and then the network session is closed in state 2910 and wait state 2906 re-entered. In some implementations, a web server status can be obtained using an HTTP "GET" command or similar command.

If in state 2906 a timer related to sending data expires, then state 2914 is entered in which a network session is attempted with the server, such as an SSL session. If the session fails, state 2910 is entered, or if the session succeeds, state 2916 is entered, in which the sensor data to be transmitted is encoded, such as in an XML format or other format. In next state 2918, sensor data is posted to the server, which can be a web server in some implementations. In some implementations, data can be sent via TP sockets using a HTTP "HPOST" command or similar command. If there is more sensor data to post, states 2916 and 2918 are re-entered, until there is no further sensor data to post, and state 2910 is entered to close the network session.

Figure 30:
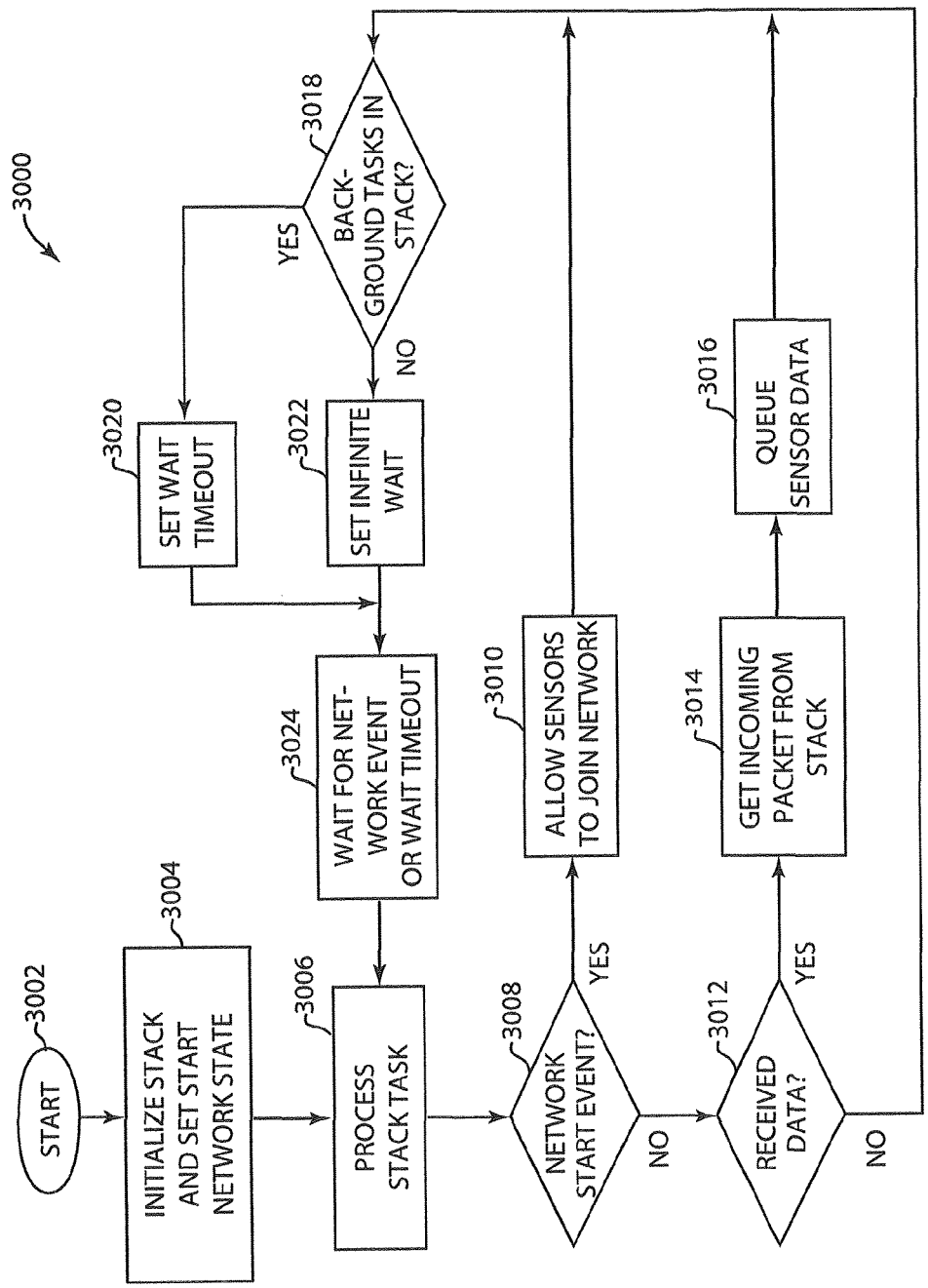
FIG. 30 is a flow diagram illustrating an example method for providing communication with sensing apparatus such as gaskets.

FIG. 30 is a flow diagram illustrating an example method 3000 for a data collector (or server) providing communication with sensing apparatus such as gaskets. This method can use, in some examples, one or more sensor data collection tasks 2710 as described above in FIG. 27.

In step 3002, the task processing method is entered, and in step 3004 the stack is initialized and network state is started. In some implementations this stack can store tasks for the data collector as well as incoming sensor data packets. In step 3006 the tasks in the stack are examined and the next one is processed. In step 3008 it is checked whether the processed task is to provide a network start event, which can be caused, for example, by a sensor apparatus (such as a gasket) being activated within range of the data collector. If so, in step 3010 any newly-discovered sensor apparatus such as gaskets are allowed to join the sensor network used by the data collector. For example, in some implementations the sensor network can be a Zigbee network and the stack can be a Zigbee stack. The method then continues to step 3018, described below.

If the processed task does not provide a network start event, then in step 3012 the method checks if the task is to process data received from one or more gaskets. If so, in step 3014 an incoming packet including sensor data is obtained from the stack and in step 3016 the sensor data is queued for transmission to a server. The method then continues to step 3018.

In step 3018, it is checked whether there are any background tasks to process in the stack. If so, a wait timeout is set in step 3020 and in step 3024 the method waits for a sensor network event to occur or for the wait timeout to expire. Once one of these occurs, the method continues to step 3006 to process the next task in the stack. If there are not any background tasks to process in step 3018, the wait timeout period is set to an infinite amount in step 3022 and step 3024 is performed as above.

Figure 31:
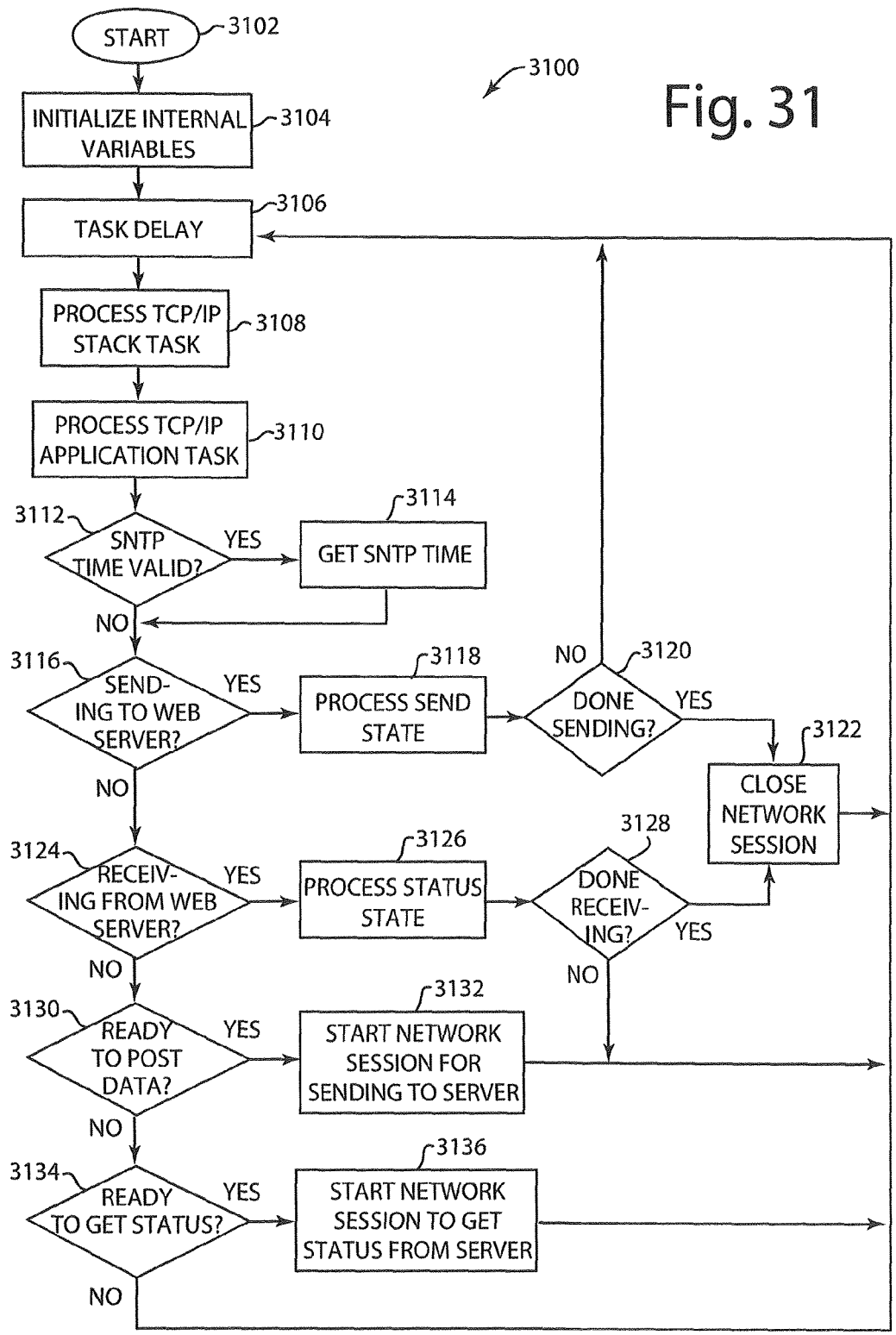
FIG. 31 is a flow diagram illustrating an example method for implementing a network task for sending data from a data collector to a server.

FIG. 31 is a flow diagram illustrating an example method 3100 for implementing a network task for sending data from a data collector to a server. Method 3100 can be implemented, for example, by a data collector 4, 16, or 2604 as described above.

The method starts in step 3102 and in step 3104 internal variables are initialized, followed by a task delay or sleep period. In step 3108 the next network task in the network stack is processed, and the next application task is processed in step 3110. In steps 3112 and 3114 the method checks for and/or gets a valid SNTP (Simple Network Time Protocol) time for synchronization with the server. If the data collector is currently sending data to the server as checked in step 3116, then in step 3118 the method processes a send state to send further data. If method is done sending data as checked in step 3120, the network session with the server is closed in step 3122. If done or not done sending, the process returns to the task delay step 3106 and processes another task.

If the data collector is receiving data from the server as checked in step 3124, then in step 3126 the method processes a status state to receive status from the server (and/or receive other information). If the data collector is done receiving as checked in step 3128, the network session with the server can be closed in step 3122, and in either case the method returns to step 3106 and processes another task.

If the data collector is ready to initialize the sending of data to the server as checked in step 3130, then in step 3132 the method starts a network session with the server, such as an SSL session in some implementations, and returns to step 3106 to process another task. If the data collector is ready to get status from the server as checked in step 3134, then in step 3136 the method starts a network session with the server, such as an SSL session in some implementations, to get the status from the server and returns to step 3106 to process another task.

Figure 32:
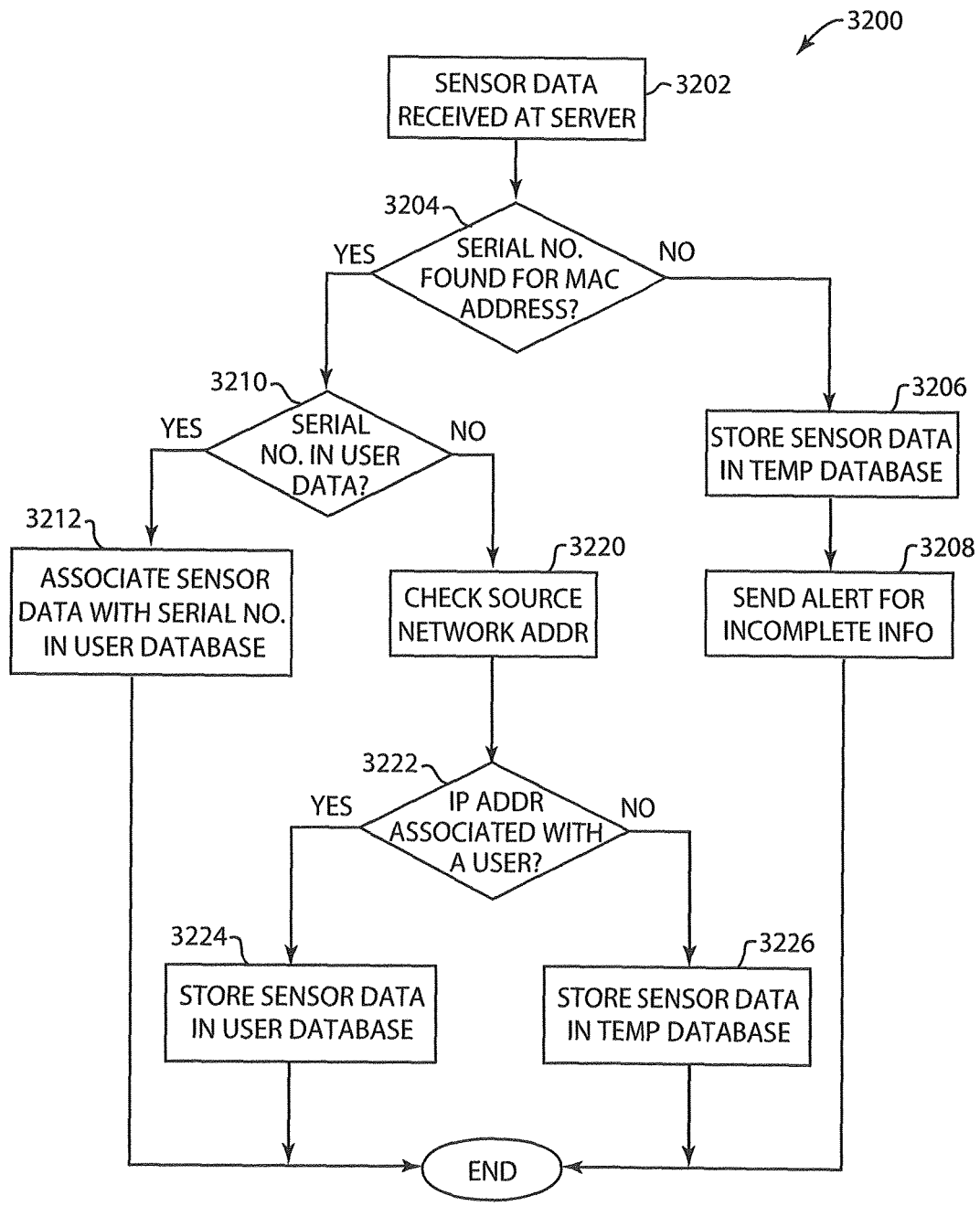
FIG. 32 is a flow diagram illustrating an example method of receiving and organizing sensor data with respect to users.

FIG. 32 is a flow diagram illustrating an example method 3200 of receiving and organizing sensor data with respect to users. Method 3200 can be implemented by a server or other data processor that receives and handles data from gaskets or other sensor apparatus as described herein. In some implementations, the sensor data received by the server includes an identifier for the particular gasket sending the data, such as a MAC address as described previously, which uniquely identifies the gasket. Furthermore, the sensor data can also include an IP address or other network address identifying the gasket. In some implementations, each gasket can be assigned a different serial number for identification purposes, which can be printed on the physical gasket in some cases. Further, some implementations require a user to initialize his or her account on a server or add new sensing gaskets from the location where the gaskets are also located. This can enable the server to associate an IP address of the user with an IP address from which the gasket sensor data is being sent. If the IP address from which a user is logging in is new, the user can be asked, in a non-limiting example, if he or she is logging in from the same location as where their associated gaskets reside.

Method 3200 includes examples of receiving and organizing sensor data in association with particular users who can access the server. In some implementations, method 3200 can also be implemented when a sensing apparatus such as a gasket is first connected to a sensing network and its data is received by a server.

In step 3202, sensor data from a gasket (or other sensing apparatus) is received at the server. In step 3204, the method checks whether a serial number can be found that corresponds to a MAC address (or other identifier) included in the received sensor data. For example, the server can store a number of MAC addresses for known gaskets and a serial number associated with each MAC address. If no serial number is found for the MAC address, then in step 3206 the sensor data is stored in a temporary database or other temporary storage, where the sensor data is associated with the MAC address. In step 3208, the method provides an alert to indicate that there is incomplete information for this MAC address, and the method ends.

If a corresponding serial number is found for the sensor data in step 3204, then in step 3210 the method checks whether the corresponding serial number is found in user data associated with particular users of the server. If the serial number is found, then in step 3212 the sensor data is associated with the serial number in the user database, such that the data is successfully associated with a user, and the method ends.

If the corresponding serial number is not found in user data in step 3210, then in step 3220 the method checks the source network address of the source data, e.g., the source IP address of the gasket that send the data, which can be found in the sensor data packet information. In step 3222, the method checks the server databases as to whether the source IP address is associated with a user or user account. If so, then in step 3224 the sensor data is stored in the user database as being associated with that user. In some implementations, the next time that this user logs into the server, he or she can be asked to map the corresponding serial number (that was not found) to an appliance, allowing appliances to be mapped to sensor gaskets. If the source IP address is not associated with a user in step 3222, then in step 3226 the sensor data is stored in a temporary database. This can occur if, for example, a user has changed an assigned IP address or has not yet established an account on the server and has connected a gasket to the network. The sensor data can be associated with the corresponding serial number and the source IP address in the temporary database until either a user logs into the server with that source IP address, or a user identifies and claims the serial number. After such an association, the source data can be associated with the user in the user database.

Figure 33:
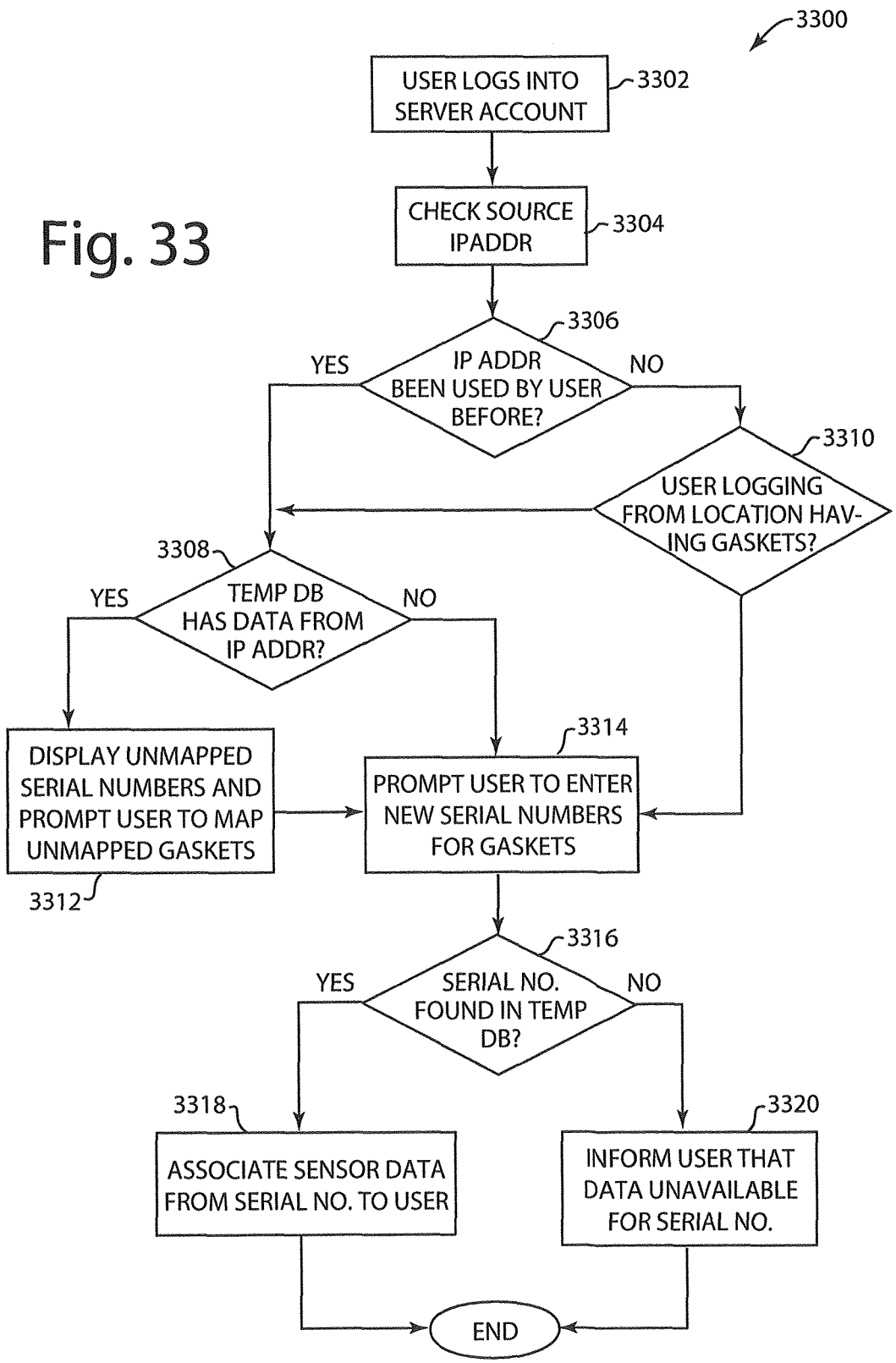
FIG. 33 is a flow diagram illustrating an example method of handling users in association with sensor data on a server.

FIG. 33 is a flow diagram illustrating an example method 3300 of handling users in association with sensor data on a server or other data processing device. In step 3302, a user logs into an account on the server, e.g., remotely over a network. In step 3304, the source network address (such as source IP address) of the user's client device is checked. If the network address has been used by this user before as determined in step 3306, then in step 3308 a temporary database is checked for sensor data received from this source network address. If the network address has not been used by this user before, then in step 3310 the method checks if the user is logging in from a location at which one or more sensing gaskets are located, e.g., by asking the user for this information. If not, then step 3314 is performed as described below to ask the user to enter new serial numbers for gaskets. If the user is logging in where gaskets are located as checked in step 3310, then step 3308 is performed to check the temporary database.

If sensor data for the source network address is found in the temporary database in step 3308, then in step 3312 the method displays the associated unmapped serial numbers found in the temporary database, and prompts the user to map the unmapped serial numbers to identifiers (such as MAC addresses) of gaskets associated with the user. The user can also provide information to allow mapping of particular appliances to the serial numbers in the server databases. The method then continues to step 3314. If sensor data is not found in step 3308, the method continues to step 3314.

In step 3314, the user is prompted to input new serial numbers for gaskets, if there are any such gaskets with which the user wishes to be associated. In step 3316, the method checks whether the input serial numbers are found in the temporary database. If so, in step 3318 the method associates sensor data for that serial number in the user database with the user currently logged in. The user can also be prompted in this step to map gasket serial numbers to particular appliances. The user's known gasket data has now been mapped. If the input serial numbers are not found in the temporary database in step 3316, then in step 3320 the user is informed that no data for this serial number is available. The user can also be prompted in this step to connect one or more gaskets to the sensing network, e.g., by powering on the gasket for operation.

Figure 34:
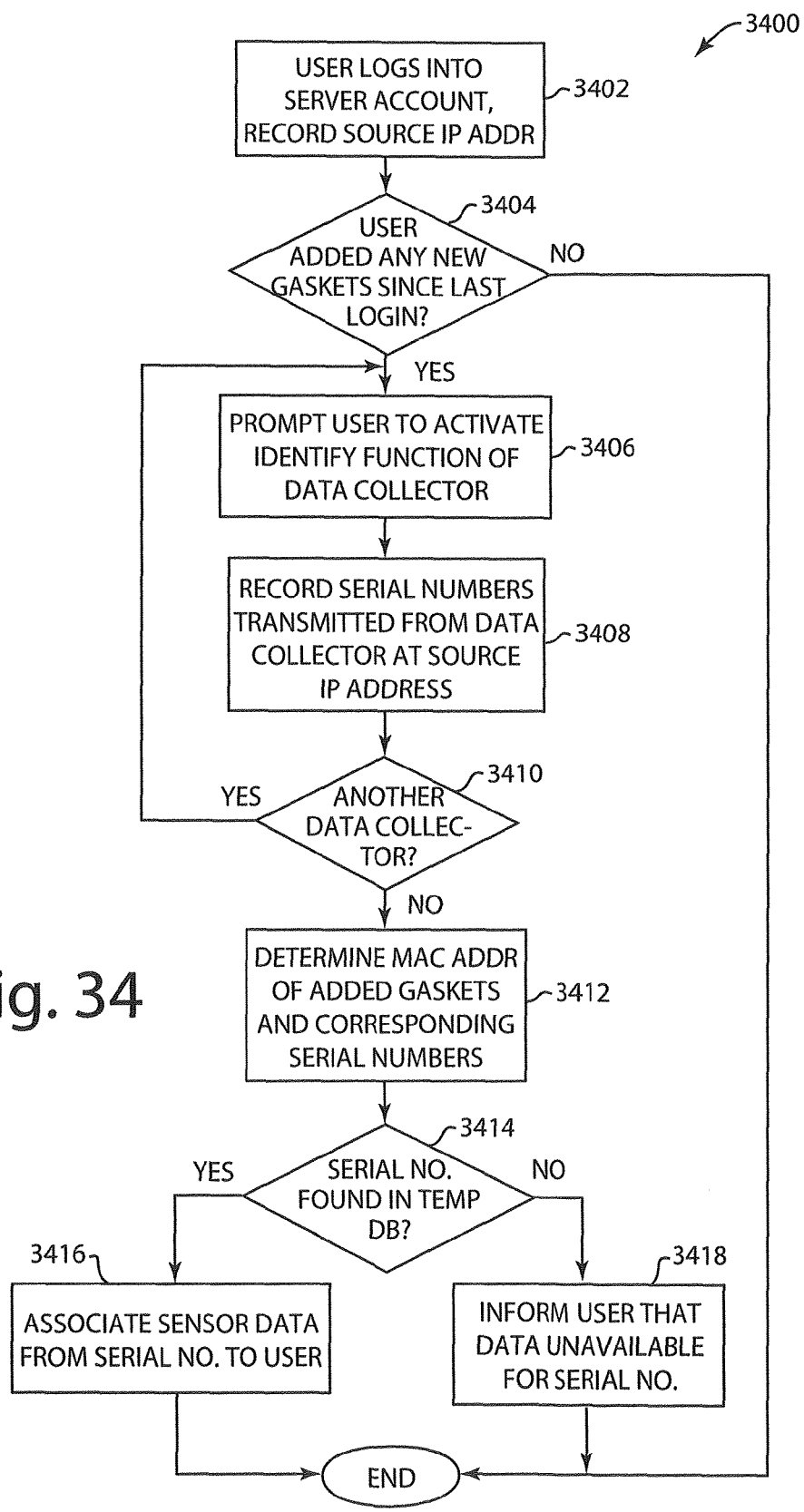
FIG. 34 is a flow diagram illustrating an example method of handling users in association with sensor data and where a data collector includes a sensor identify function.

FIG. 34 is a flow diagram illustrating an example method 3400 of handling users in association with sensor data on a server or other data processing device, where the data collector in the system includes an identify function for transmitting information about sensing apparatus connected to its sensing network.

Some implementations can provide a data collector 4, 16, or 2604 which includes a sensor identify function. This function, when activated, causes the data collector to transmit the serial number, MAC address, and/or other identifiers of all sensing apparatus, such as gaskets, that connect to that data collector via the sensor network. The server can receive this transmitted identifier information for processing. In some implementations, in response to a user adding one or more new gaskets to a sensing network, the user can be asked or required to activate the identify function on an associated data collector while that user is logged into a server. This function can add security to some implementations of the sensing system to verify that a user is associated with particular sensor data. Various implementations can use different mechanisms to activate the identify function. For example, a physical or displayed button (or other type of control) on the data collector can be pushed or otherwise activated by a user to activate the function in some implementations.

In some example implementations, handling received sensor data and users at a server as described in FIG. 32 can be performed differently if an identify function is used. For example, steps 3220, 3222, and 3224 of FIG. 32 can be omitted and step 3226 can store the data in the temporary database associated with serial number and IP address. A user can be associated with the sensor data in the temporary database in response to the user activating the identify function while being logged into the server, since the identify function will cause the server to receive the transmitted serial numbers (or transmitted MAC addresses which can be matched to the serial number) which are mapped to the user currently logged in. Such an implementation can be advantageous in that it can reduce errors as well as increase security of the sensing system. For example, the identify function can reduce the need to associate the data with the IP address while the user is not logged on, and can reduce errors if the user's IP address changes often. It can also reduce the need for the user to input the serial number of the gasket. Potential errors resulting from inputting serial numbers and/or inputting gaskets at the user's location can be reduced or eliminated.

In the method 3400, a server associates sensor data with a user that has an identify function of a data collector available. A user remotely logs into his or her server account in step 3402 and the source IP address of the user is recorded. In step 3404, the method checks if the user has added any new gaskets to the sensing network since the last login of the user, e.g., by prompting the user for such information. If not, the method ends. If the user has added one or more new gaskets, then in step 3406 the method prompts the user to activate the identify function on the data collector to which the user has access. In step 3408, the method records serial numbers (or other gasket identifiers) transmitted from the data collector that is located at the user's source network address. In step 3410, the method checks if there is another data collector for the user to activate, e.g., by asking the user. If so, the method returns to step 3406 to prompt the user to activate the identify function on the other data collector.

In step 3412 the method determines the MAC addresses of the gaskets that have been newly added to the sensing network (e.g., if the server received transmitted serial numbers in step 3408). The serial numbers corresponding to determined MAC addresses can be correlated based on the server database information. If a MAC address is not found in the files of the server, then an alert can be provided to the user. In step 3414, the method checks if the serial number of an added gasket is found in the temporary database. If so, then in step 3416 the sensor data for that serial number is associated in the user database with the user currently logged in. The user can also be prompted to map gasket serial numbers to particular appliances. If the serial number of an added gasket is not found in the temporary database, then in step 3418 the user is informed that no data for this serial number is available. The user can also be prompted to connect one or more gaskets to the sensing network, and the method ends.

It should be noted that the steps and operations of the methods described in FIGS. 25 and 27-34 can be implemented in the order of operations shown, in a different order, and/or some of the operations performed simultaneously where appropriate. Some implementations of these methods can take the form of a computer program product accessible from a computer-usable or computer-readable medium providing program code for use by or in connection with a computer, processor, or any instruction execution system. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable storage medium include a semiconductor or solid-state memory, magnetic tape, a removable computer diskette, a random access memory (RAM), a read-only memory (ROM), a rigid magnetic disk and an optical disk, a solid-state memory drive, etc. Alternatively, these methods can be implemented in hardware (logic gates, etc.), or in a combination of hardware and software.

A sensing apparatus, such as a gasket, with one or more features as described herein can send sensor data to a receiving device such as a data collector 16 and/or server 18. Any of various features can be used in the sensing system. For example, received data can be time-stamped at time of arrival at the receiving device. Thus the data can be associated with the time, location and the appliance related to the sensed measurement. In some implementations, the gasket can timestamp measured data points at the time of measurement and before they are transmitted to provide increased precision and avoid a varying and/or unknown delay between the time of measurement and time of arrival of data at a receiving device. For example, the real-time clock 416 can be used to provide the time for the timestamps. The timestamp information can be included in the data packet that is transmitted from the gasket, to be extracted and used as the timestamp by the receiving device.

In some implementations, the sensing apparatus, such as a gasket, can include recovery mechanisms to overcome temporary network failure. The averaged data points can be stored in memory local to the gasket during network failure instead of transmitting them, e.g., by increasing the allocated amount of memory available on the gasket. The oldest data in memory can be overwritten by newly measured data if the memory becomes full, allowing the latest set of data to be stored on the gasket (e.g., with associated timestamps), ready to be transmitted by the gasket when network communications are restored.

Some implementations enable the receiving device to identify the appliance connected to a sensing apparatus, such as a gasket, by examining received data and identifying unique characteristics of a transient current of the appliance when it is first powered on. For example, this identification can be made on the receiving device after the data on the gasket has been transmitted by matching incoming data with a table or database on the receiving device storing previously-received data that corresponds to specific appliances. In this manner, the data can be used to identify an electronic "signature" of the appliance as a means of identifying that appliance.

Another feature used in some implementations of the sensing apparatus, such as a gasket, is remote software or firmware updating. In one example implementation, program instructions to manage the update can be stored in a part of the gasket's memory that is not part of the operating system. During a remote software update, the gasket can continue to operate by taking instructions from that code. The new software can be transmitted wirelessly, and overwrite the existing code with the new code.

In some example implementations, a data collector can be activated by a user with a local web server user interface embedded in the data collector device. Web pages can guide the user through a process of authenticating the data collector device with a web server. For example, SSL keys and a SSL certificate "hash" can be downloaded to the data collector device from the web server for future secure communications. In some implementations, the data collector firmware can use a publicly available web server. Some examples can provide a proprietary web server "listener" to integrate the sensor data from the data collector into a database.

In an example implementation that senses power consumption, sensing gaskets can send an averaged mean squared power measurement every predetermined time interval to the data collector, such as every 10 seconds. The data collector can accumulate this data in a packet tagged with the gasket MAC address. The data collector can then send data accumulated from each gasket to the web server every longer time interval, such as one minute. The data collector firmware can handle the data for many gaskets at this frequency. The hardware configuration can be scaled up with more memory such as SRAM if the frequency of data collection or the number of sensing gaskets increases.

In some implementations that sense power consumption and which use a server that cannot receive transmissions until after a predetermined interval, if it is necessary to capture data, the data collector (or a server) can determine if each sensor is active, and use an "accumulate power" function to add a number of watt-hours consumed since the last capture to a cumulative power consumption value. The cumulative value and the time at which it was captured can also be added to a queue of data points. For example, if a data collector task determines that a sufficient interval has passed since the last data transmission attempt, it can open a secure socket to an upload path (determined at activation), and transmit the queued data points to the server. The data collector can function as an HTTP client for this process, for example. During these operations, the data collector can store the count of transmitted packets, count of errors, and/or other status information in a series of counters. When time to update device status information, the data collector can determine a signal quality value from these counters, and upload this value and other information from these counters to the server. Authentication of the SSL session can use hashed values of the server's public key setup during device activation, in some implementations.

It should be noted that the diagrams described herein may illustrate functional blocks and that the components may be arranged differently. For example, memory 422 of FIG. 4 may be integrated into the controller 420 and/or other components may be integrated or separately connected. These and other design variants will be appreciated by those of ordinary skill in the art. It should also be noted that various features and implementations for gaskets described herein can apply to other forms and types of sensing apparatus consistent with the disclosure.

Although various examples have been described using specific terms and devices, such description is for illustrative purposes only. The words used are words of description rather than of limitation. In addition, it should be understood that aspects of various other examples may be interchanged either in whole or in part. It is therefore intended that the claims be interpreted in accordance with their true spirit and scope and without limitation or estoppel.

What is claimed is:

1. A sensing apparatus for an appliance connector, the sensing apparatus comprising:
    at least one substrate including one or more openings operative to receive a corresponding number of prongs of the appliance connector;
    at least one sensor coupled to the substrate and operative to sense at least one characteristic of an environment;
    a transmitter coupled to the substrate and operative to transmit one or more signals derived from the at least one sensed characteristic, wherein the transmitted signals are capable of being received by a receiving device; and
    a power circuit coupled to the substrate and operative to provide power to the at least one sensor and to the transmitter, wherein the power circuit is capacitively coupled to at least one of the prongs of the appliance connector or coupled to wirelessly receive power transmitted from a remote source to drive the transmitter and the at least one sensor.

2. The sensing apparatus of claim 1 further comprising a gasket housing separate from and physically engaged with a housing of the appliance connector, wherein the gasket housing houses the transmitter and the power circuit, and wherein the gasket housing includes a plurality of housing openings operative to receive a plurality of prongs of the appliance connector.

3. The sensing apparatus of claim 1 wherein the at least one substrate is included within a housing of the appliance connector, and wherein the transmitter and power circuit are housed within the housing of the appliance connector.

4. The sensing apparatus of claim 1 wherein the at least one sensor senses at least one characteristic of the electric current flowing through the at least one prong, and wherein the one or more transmitted signals include information indicative of a power consumption of the appliance.

5. The sensing apparatus of claim 1 wherein the sensor measures an intensity of a magnetic field generated by the electric current passing through the at least one prong of the appliance connector.

6. The sensing apparatus of claim 2 wherein the gasket housing is operative to be engaged with the plurality of prongs of the appliance connector while the appliance connector is connected to an electrical outlet, and wherein the power circuit generates DC power from the electric current flowing through the at least one prong, the DC power provided to drive at least the sensor and the transmitter.

7. The sensing apparatus of claim 1 wherein the one or more transmitted signals include information indicative of a power consumption of the appliance, and wherein the one or more signals are transmitted periodically to the receiving device that includes a remote server.

8. The sensing apparatus of claim 1 further comprising at least one processor coupled to the at least one sensor and to the transmitter, and wherein the transmitter transmits the one or more signals via wireless communication.

9. The sensing apparatus of claim 1 wherein a housing houses the power circuit, and further comprising a removable module physically distinct from the housing and operative to be connected to the housing by one or more connectors provided on the housing, wherein the module includes at least one of: the at least one sensor, memory for storing sensor data, and memory for storing programming instructions for the gasket.

10. The sensing apparatus of claim 1 wherein a housing houses the power circuit, the at least one sensor, and the transmitter, wherein the at least one sensor and the power circuit are integrated on the substrate that is a single flex circuit board provided between a top cover of the housing and a bottom cover of the housing, and wherein the sensing apparatus further comprises at least one ferrite ring that is coupled to the flex board.

11. The sensing apparatus of claim 1 further comprising at least one ring of material provided around at least one of the plurality of openings, wherein the ring of material has a magnetic permeability operative to concentrate a magnetic field generated by electric current flowing through the at least one prong, and wherein the at least one sensor includes a Hall effect sensor, wherein the at least one sensor is operative to measure an intensity of the generated magnetic field and convert the measured intensity to the electrical signal representative of the intensity.

12. The sensing apparatus of claim 1 further comprising memory storing instructions governing operation of the sensing apparatus, and a standardized interface connector coupled to the memory, the standardized interface connector operative to be connected to an electronic device that is operative to provide configuration and programming of the instructions.

13. The sensing apparatus of claim 1 wherein the at least one sensor is a plurality of sensors, and wherein the plurality of sensors include sensors of a plurality of different types, each type for sensing a different characteristic of the environment.

14. The sensing apparatus of claim 1 wherein the power circuit includes a surge protection circuit operative to protect at least the power circuit from power surges and spikes in the electric current, wherein the surge protection circuit includes a power rectifier.

15. The sensing apparatus of claim 1 further comprising a location circuit operative to receive location signals and provide location information indicative of a physical location of the sensing apparatus, the location information to be output by the transmitter.

16. A system comprising:
a sensing apparatus coupled to an appliance connector of an appliance, the appliance connector being coupled to a power supply, wherein the sensing apparatus includes:
at least one substrate including one or more openings operative to receive a corresponding number of prongs of the appliance connector;
at least one sensor coupled to the substrate and operative to sense at least one characteristic of an environment;
a transmitter coupled to the substrate and operative to transmit one or more signals derived from the at least one sensed characteristic; and
a power circuit coupled to the substrate and operative to provide power to the at least one sensor and to the transmitter, wherein the power circuit is capacitively coupled to at least one of the prongs of the appliance connector or coupled to wirelessly receive power transmitted from a remote source to drive the transmitter and the at least one sensor; and
a receiving device located remotely from the sensing apparatus and operative to receive the one or more signals from the transmitter, wherein the receiving device is operative to provide the one or more signals for use as data describing the at least one sensed environmental characteristic.

17. A method for sensing using a sensing apparatus, comprising:
sensing at least one characteristic of an environment using at least one sensor provided in a housing and coupled to a power connector of an appliance;
transmitting one or more signals using a transmitter included in a housing, wherein the one or more signals are derived from the at least one sensed characteristic, and wherein the transmitted signals are received by a receiving device; and
using power circuitry included in the housing, wherein the power circuitry is capacitively coupled to at least one of the prongs or coupled to wirelessly receive power transmitted from a remote source to drive the transmitter and the at least one sensor.

18. The method of claim 17 wherein the sensing at least one characteristic includes sensing at least one characteristic of electric current flowing through at least one of a plurality of prongs of the power connector, and wherein the one or more transmitted signals include information indicative of a power consumption of the appliance.

19. The method of claim 18 further comprising providing at least one ring of material around at least one prong to concentrate a magnetic field generated by electric current passing through the at least one prong, and wherein the sensing includes measuring an intensity of the magnetic field.

* * * * *